(12) United States Patent
Chang et al.

(10) Patent No.: US 12,532,492 B2
(45) Date of Patent: Jan. 20, 2026

(54) STRUCTURE AND FORMATION METHOD OF SEMICONDUCTOR DEVICE WITH EPITAXIAL STRUCTURES

(71) Applicant: Taiwan Semiconductor Manufacturing Company, Ltd., Hsinchu (TW)

(72) Inventors: Jung-Hung Chang, Yuanlin (TW); Shih-Cheng Chen, New Taipei (TW); Chih-Hao Wang, Baoshan Township, Hsinchu County (TW); Chia-Cheng Tsai, Hsinchu (TW); Kuo-Cheng Chiang, Zhubei (TW); Zhi-Chang Lin, Zhubei (TW); Chien-Ning Yao, Hsinchu (TW); Tsung-Han Chuang, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 378 days.

(21) Appl. No.: 18/302,177

(22) Filed: Apr. 18, 2023

(65) Prior Publication Data

US 2024/0355901 A1    Oct. 24, 2024

(51) Int. Cl.
| | |
|---|---|
| *H01L 29/66* | (2006.01) |
| *H10D 30/01* | (2025.01) |
| *H10D 30/43* | (2025.01) |
| *H10D 30/67* | (2025.01) |
| *H10D 62/10* | (2025.01) |
| *H10D 64/01* | (2025.01) |

(52) U.S. Cl.
CPC ........... *H10D 30/014* (2025.01); *H10D 30/43* (2025.01); *H10D 30/6735* (2025.01); *H10D 62/121* (2025.01); *H10D 64/017* (2025.01); *H10D 64/018* (2025.01); *H10D 64/021* (2025.01)

(58) Field of Classification Search
CPC .. H10D 30/014; H10D 30/43; H10D 30/6735; H10D 62/121; H10D 64/017; H10D 64/018; H10D 64/021; H10D 30/6757; H10D 62/151; H10D 62/116
See application file for complete search history.

(56) References Cited

U.S. PATENT DOCUMENTS

| | | |
|---|---|---|
| 8,836,016 B2 | 9/2014 | Wu et al. |
| 8,841,701 B2 | 9/2014 | Lin et al. |

(Continued)

*Primary Examiner* — Elmito Breval
(74) *Attorney, Agent, or Firm* — Birch, Stewart, Kolasch & Birch, LLP

(57) ABSTRACT

A method for forming a semiconductor device structure includes forming a fin structure, and the fin structure has multiple sacrificial layers and multiple semiconductor layers laid out alternately. The method also includes forming a gate stack wrapped around the fin structure and forming a spacer layer extending along sidewalls of the fin structure and the gate stack. The method further includes partially removing the fin structure and the spacer layer to form a recess exposing side surfaces of the semiconductor layers and the sacrificial layers. A remaining portion of the spacer layer forms a gate spacer. In addition, the method includes forming an inner spacer layer along a sidewall and a bottom of the recess and partially removing the inner spacer layer using an isotropic etching process. Remaining portions of the inner spacer layers form multiple inner spacers. The method includes forming an epitaxial structure in the recess.

20 Claims, 30 Drawing Sheets

(56) References Cited

U.S. PATENT DOCUMENTS

| | | |
|---|---|---|
| 8,847,293 B2 | 9/2014 | Lee et al. |
| 8,853,025 B2 | 10/2014 | Zhang et al. |
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,520,482 B1 | 12/2016 | Chang et al. |
| 9,576,814 B2 | 2/2017 | Wu et al. |

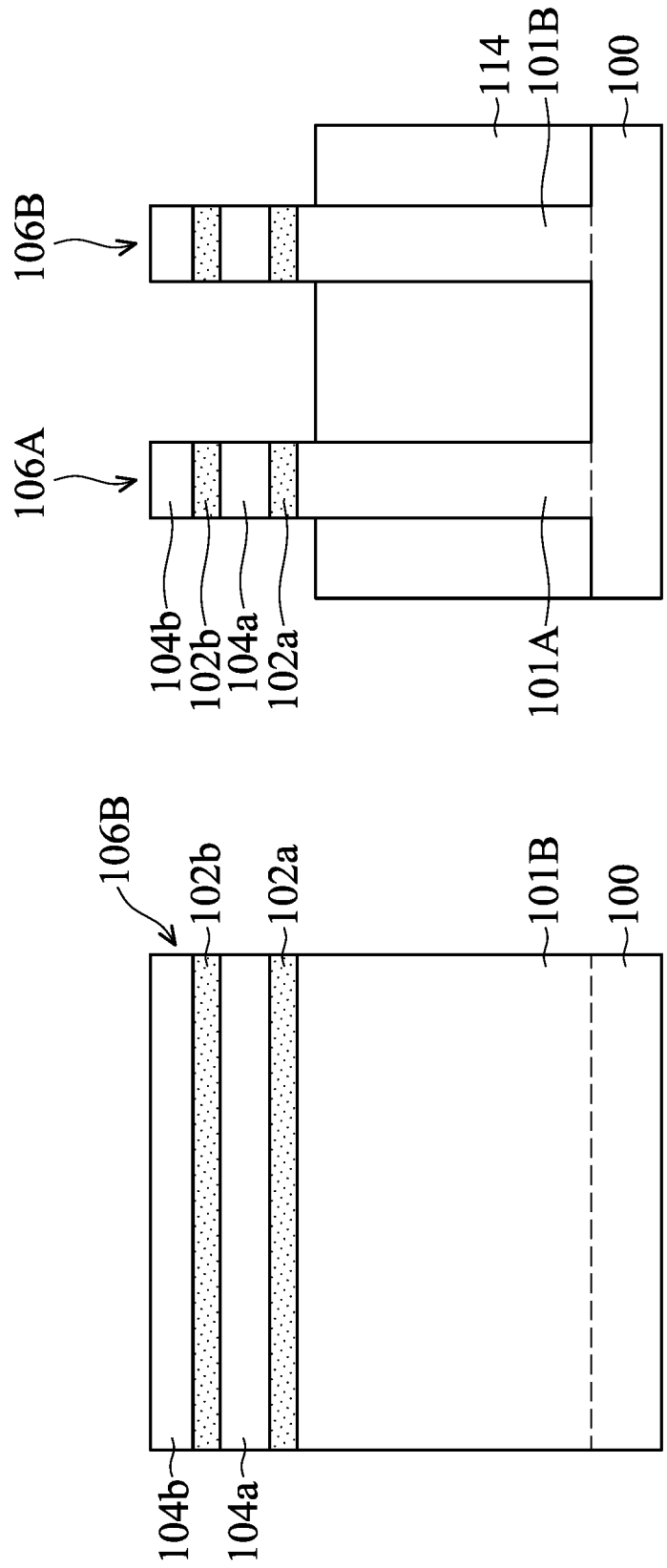

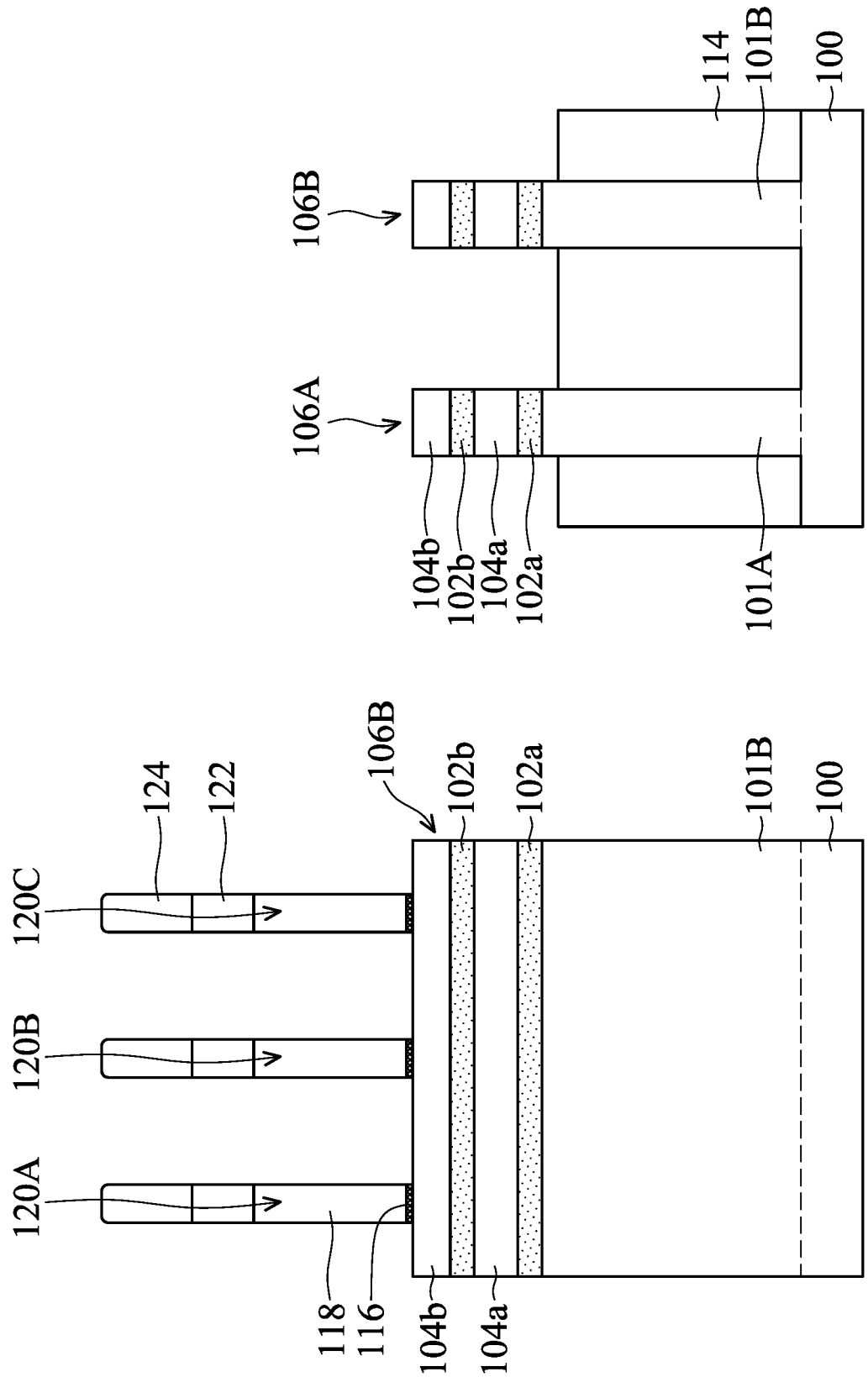

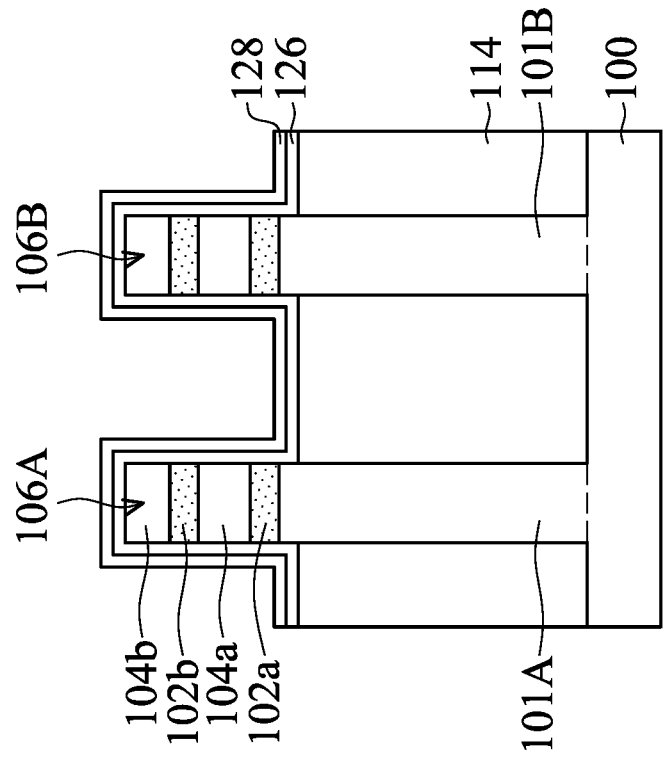
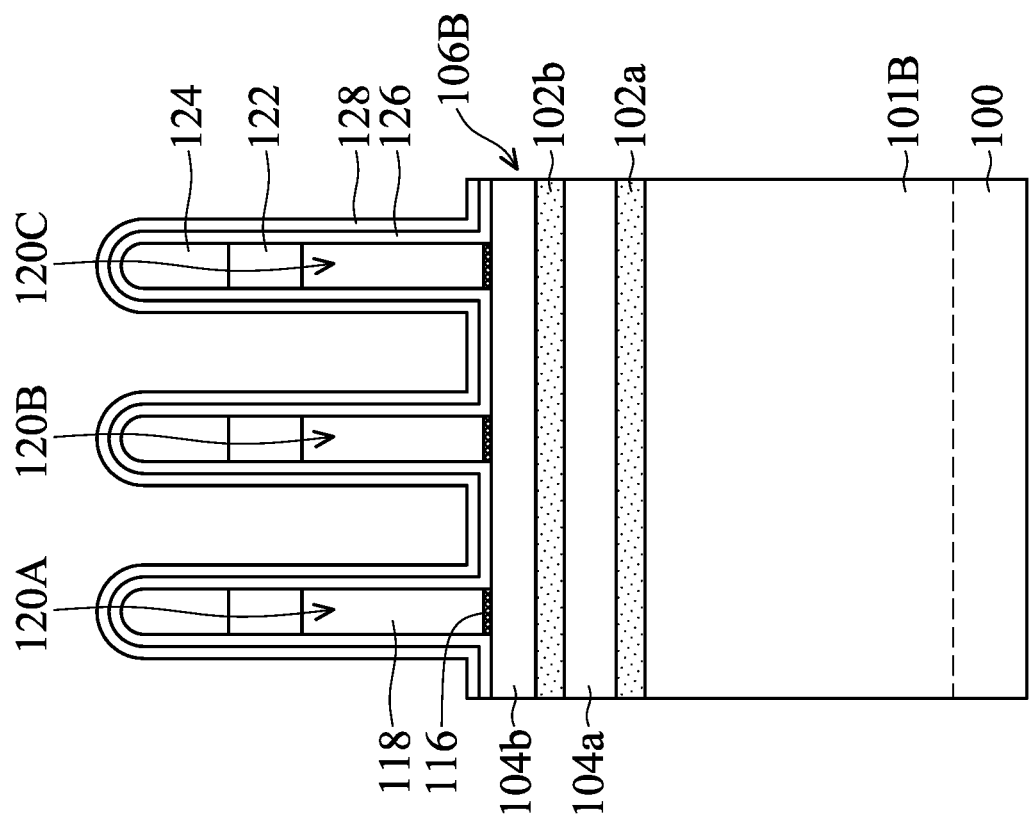
FIG. 2C-1
FIG. 2C-2

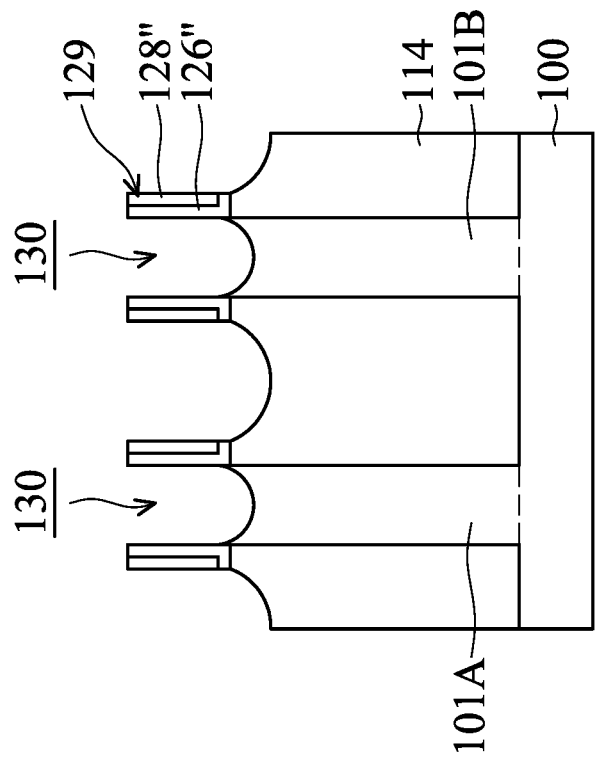
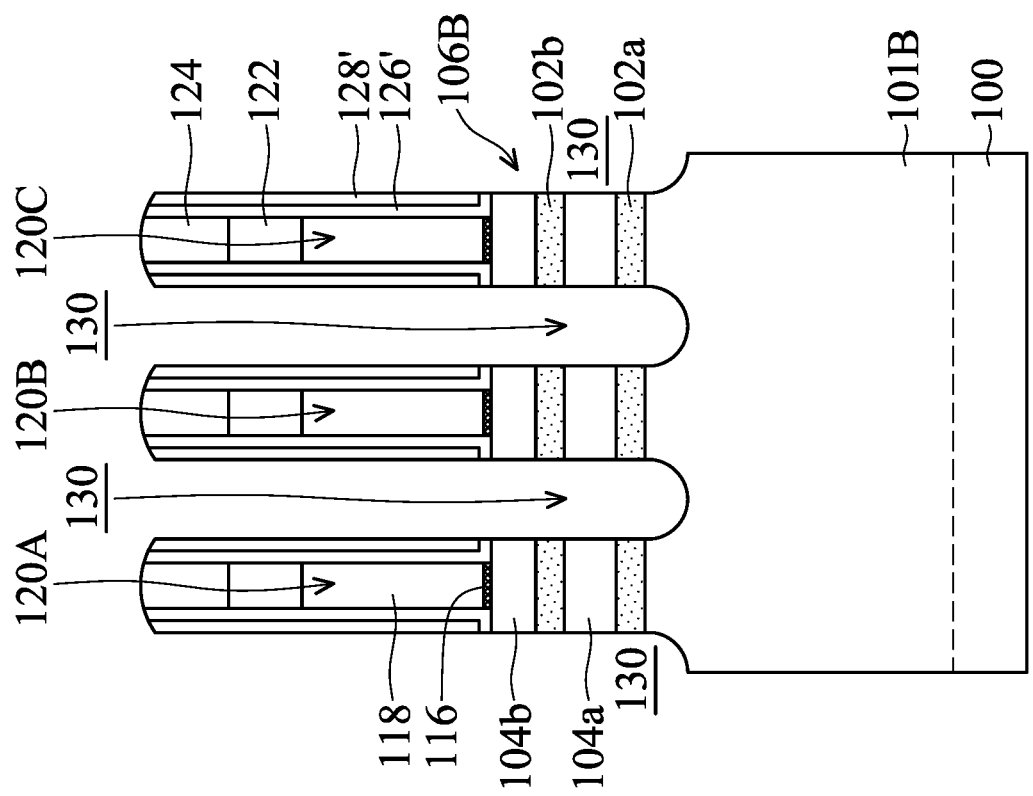
FIG. 2D-2
FIG. 2D-1

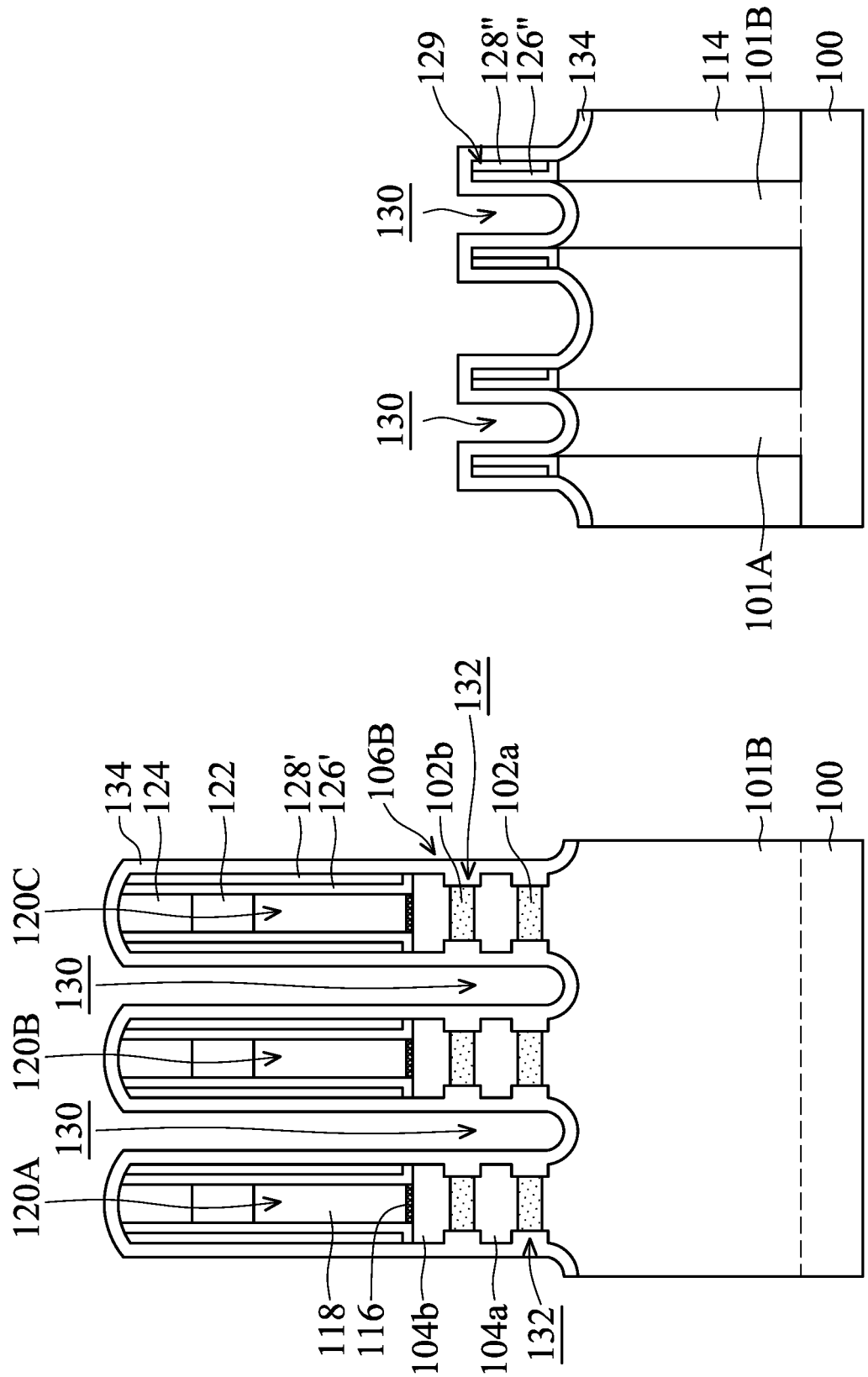

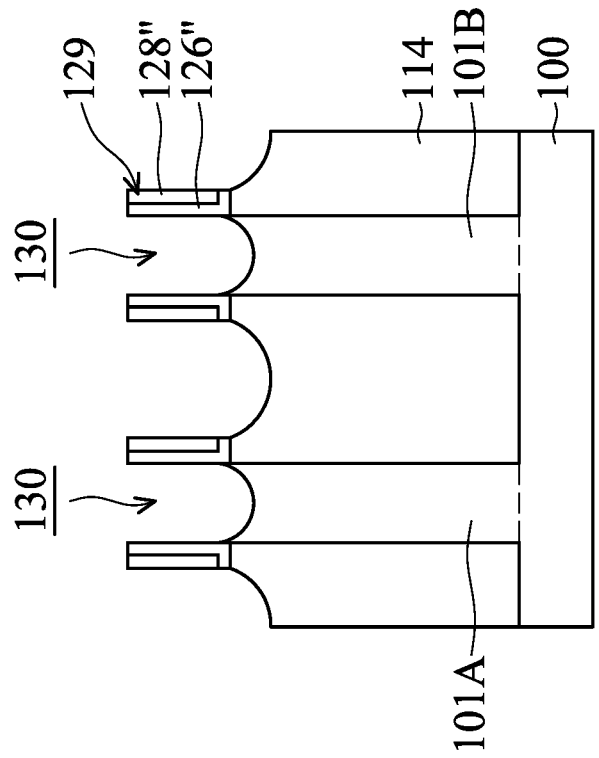
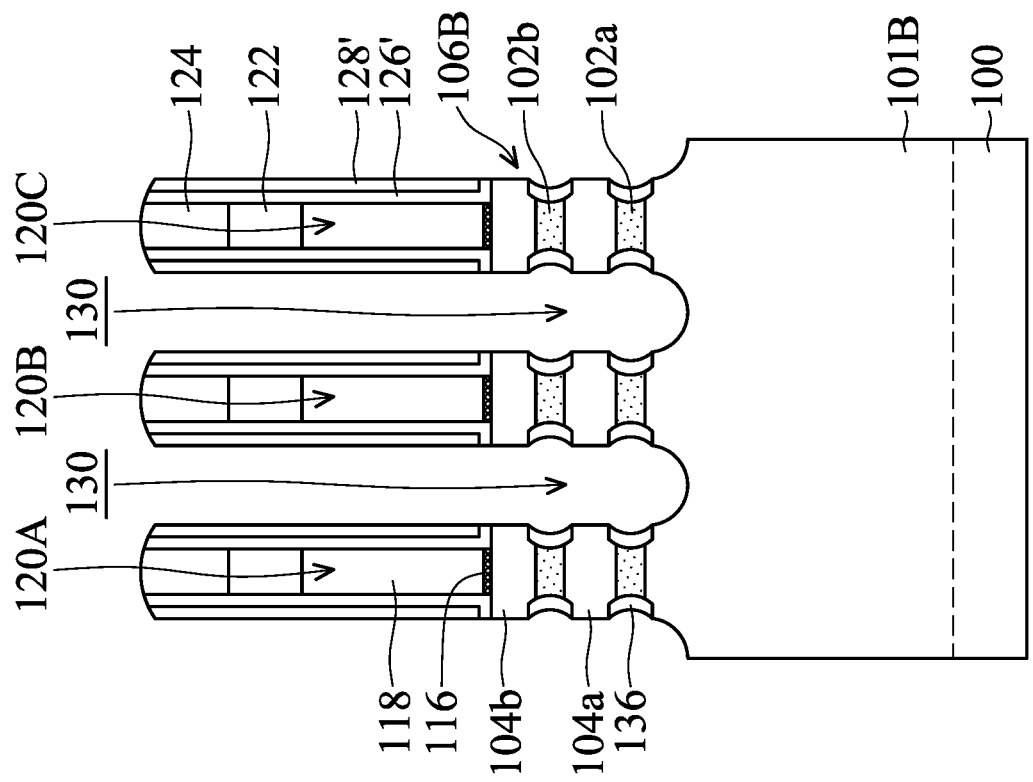
FIG. 2F-1
FIG. 2F-2

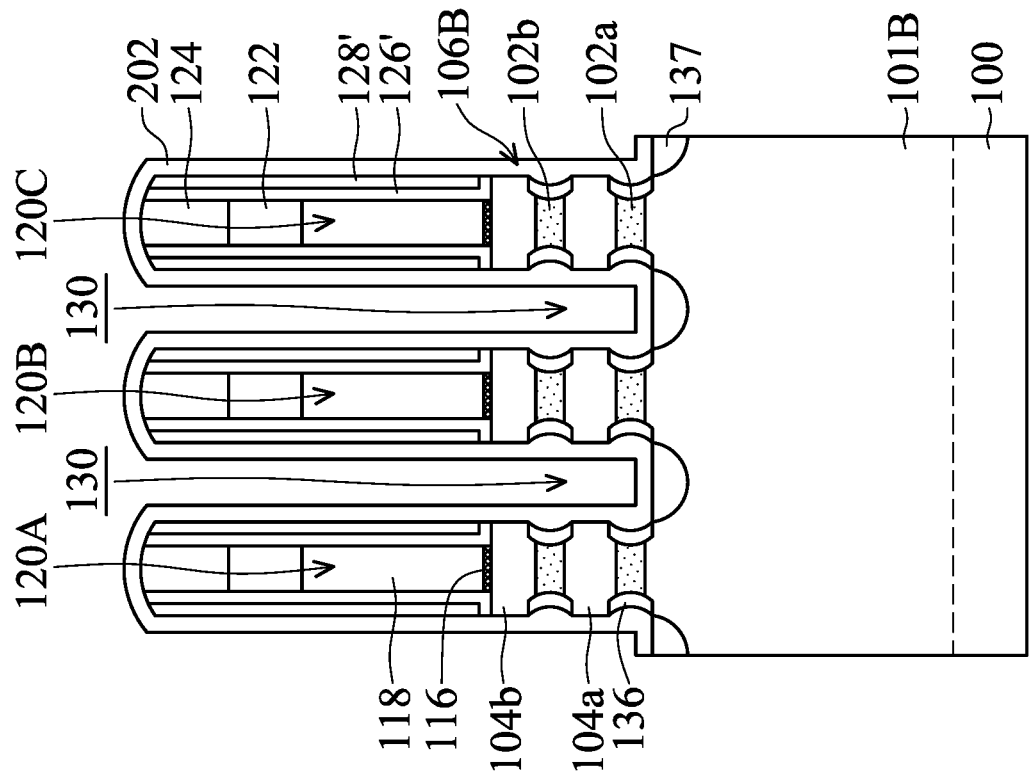
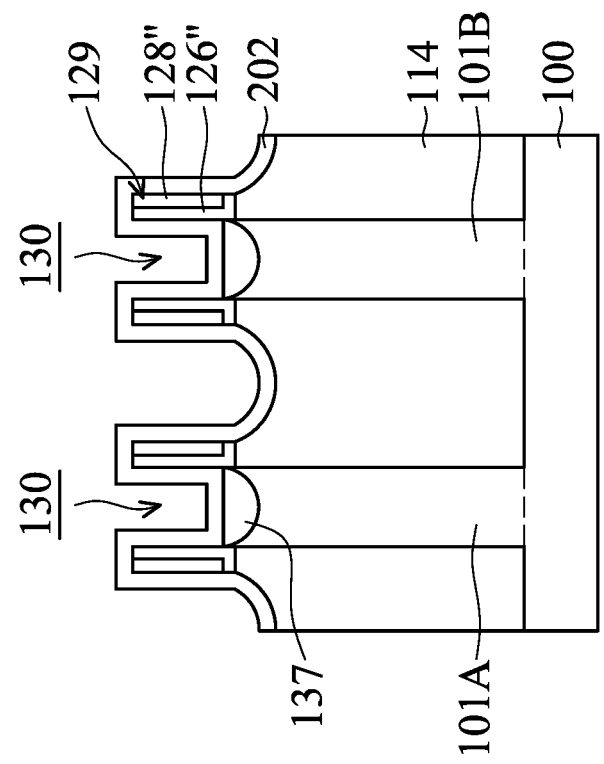
FIG. 2H-1
FIG. 2H-2

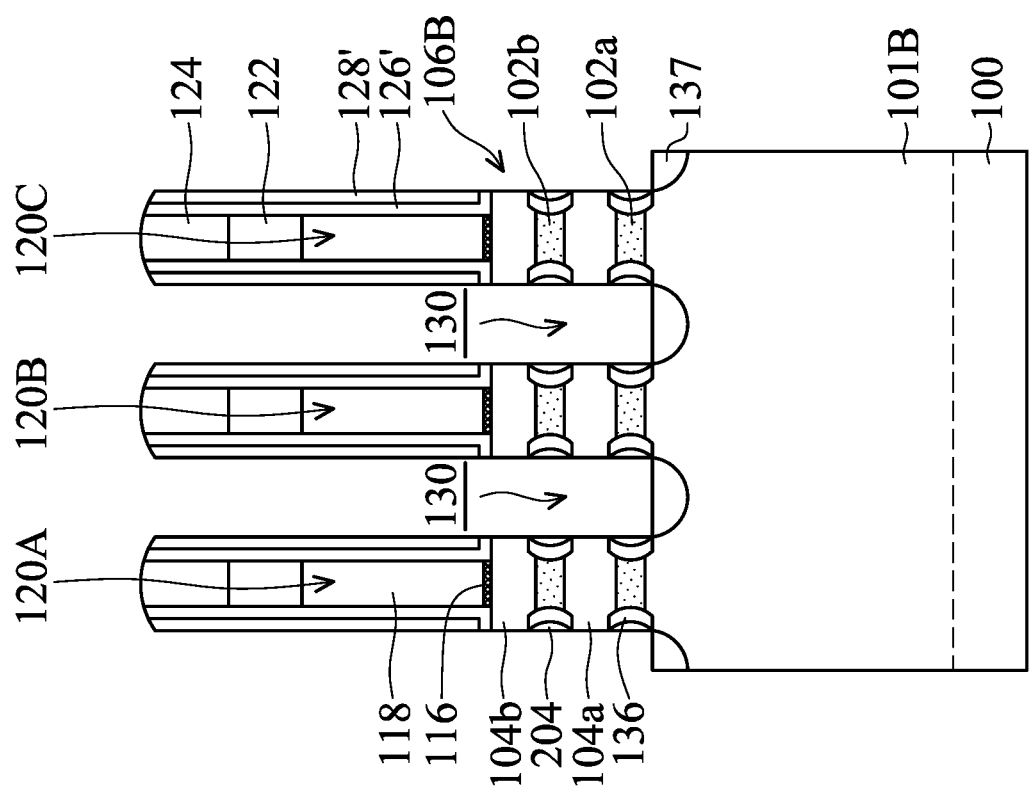
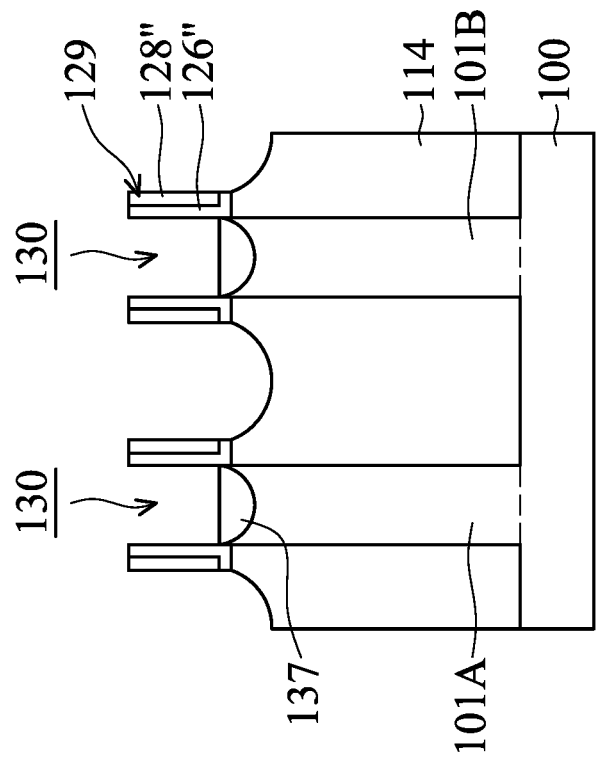
FIG. 2I-1
FIG. 2I-2

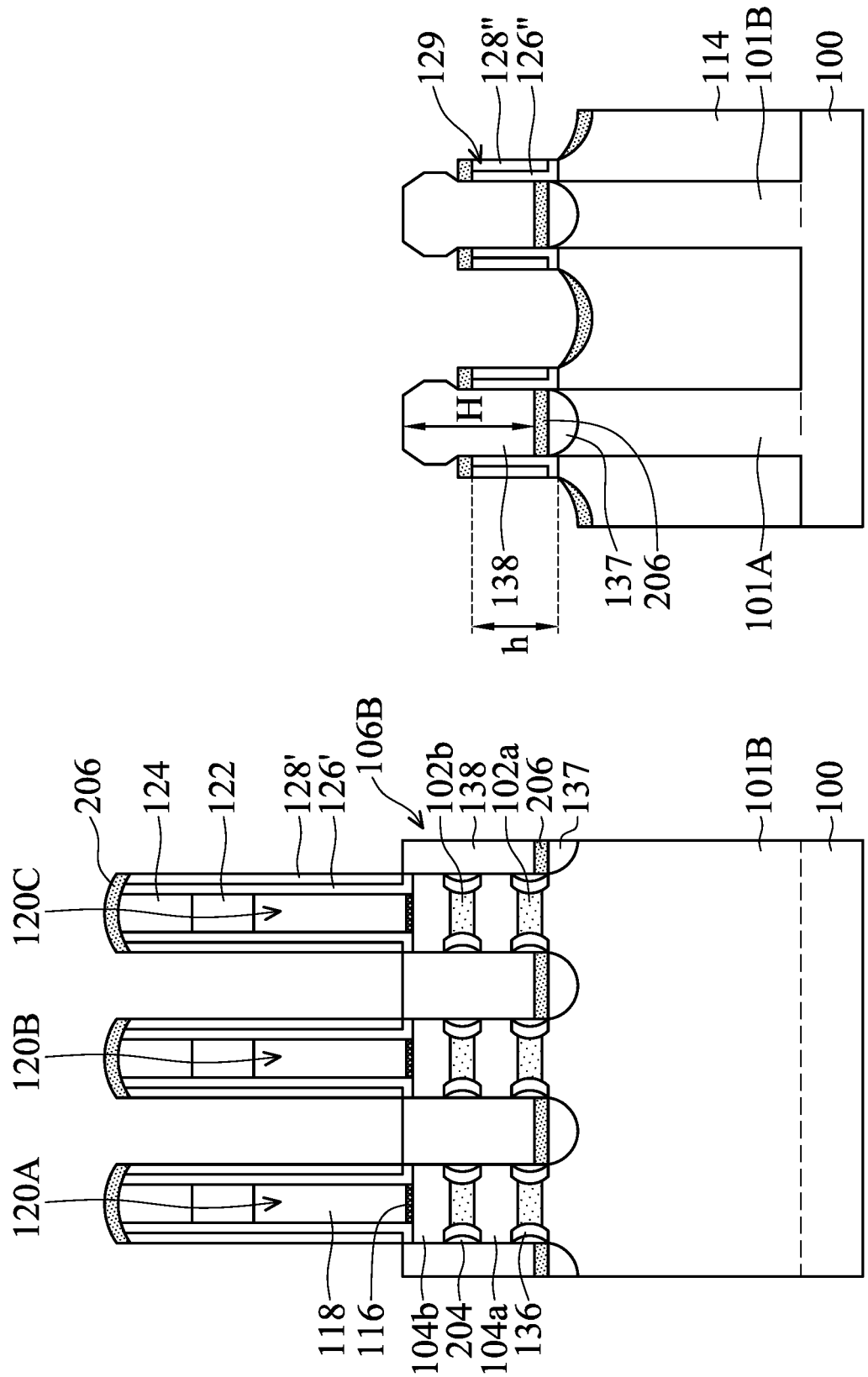

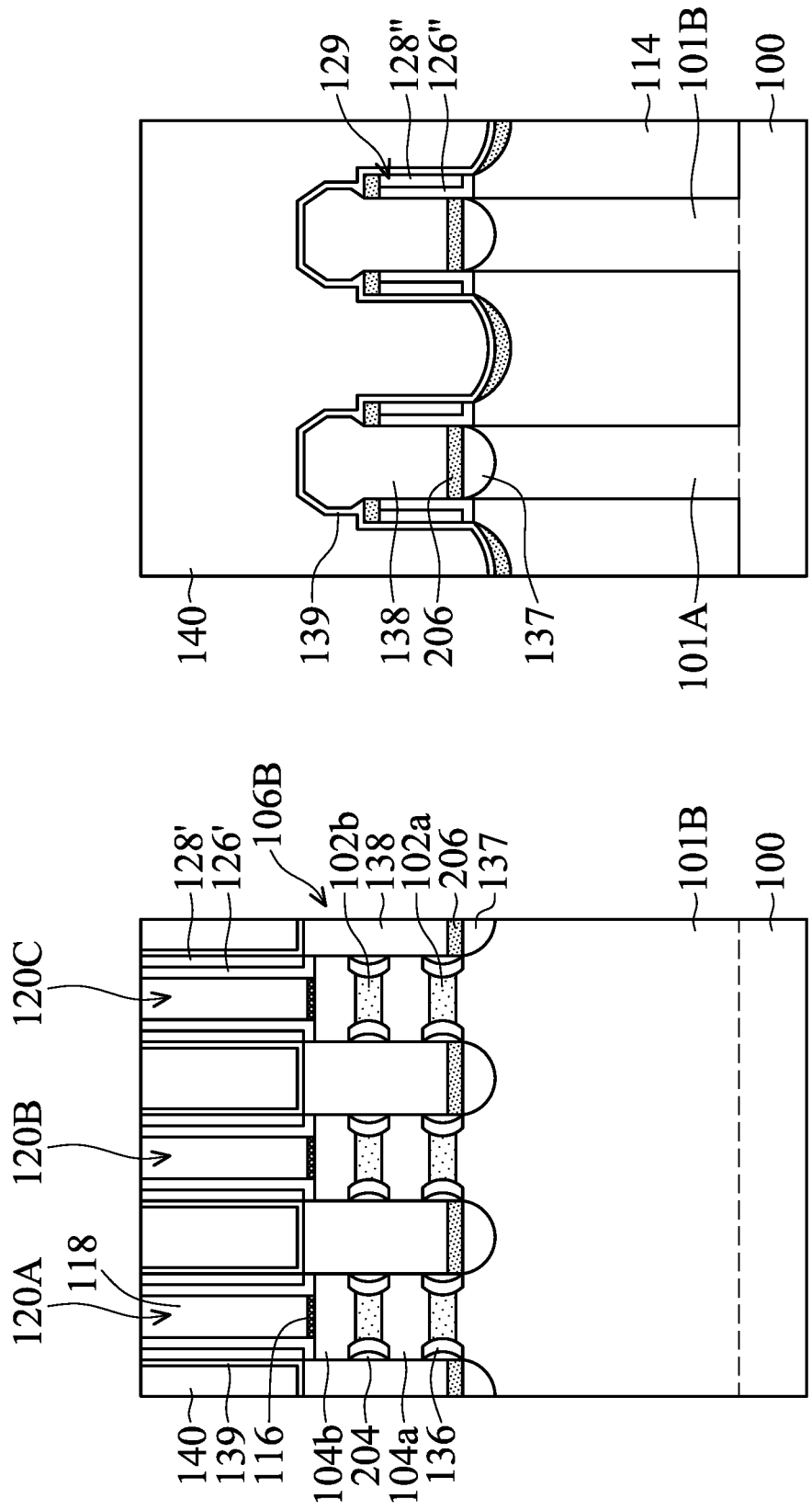

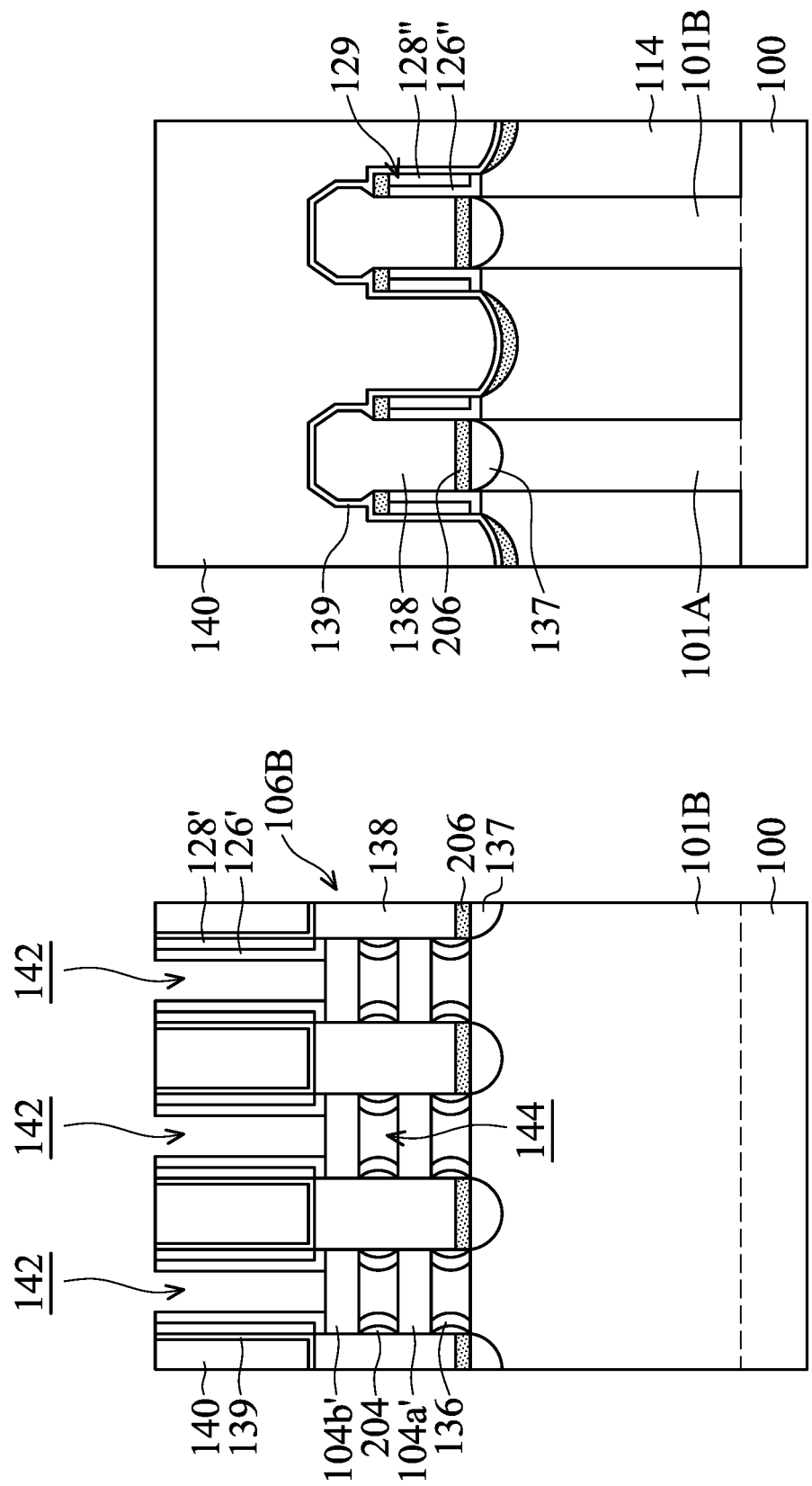

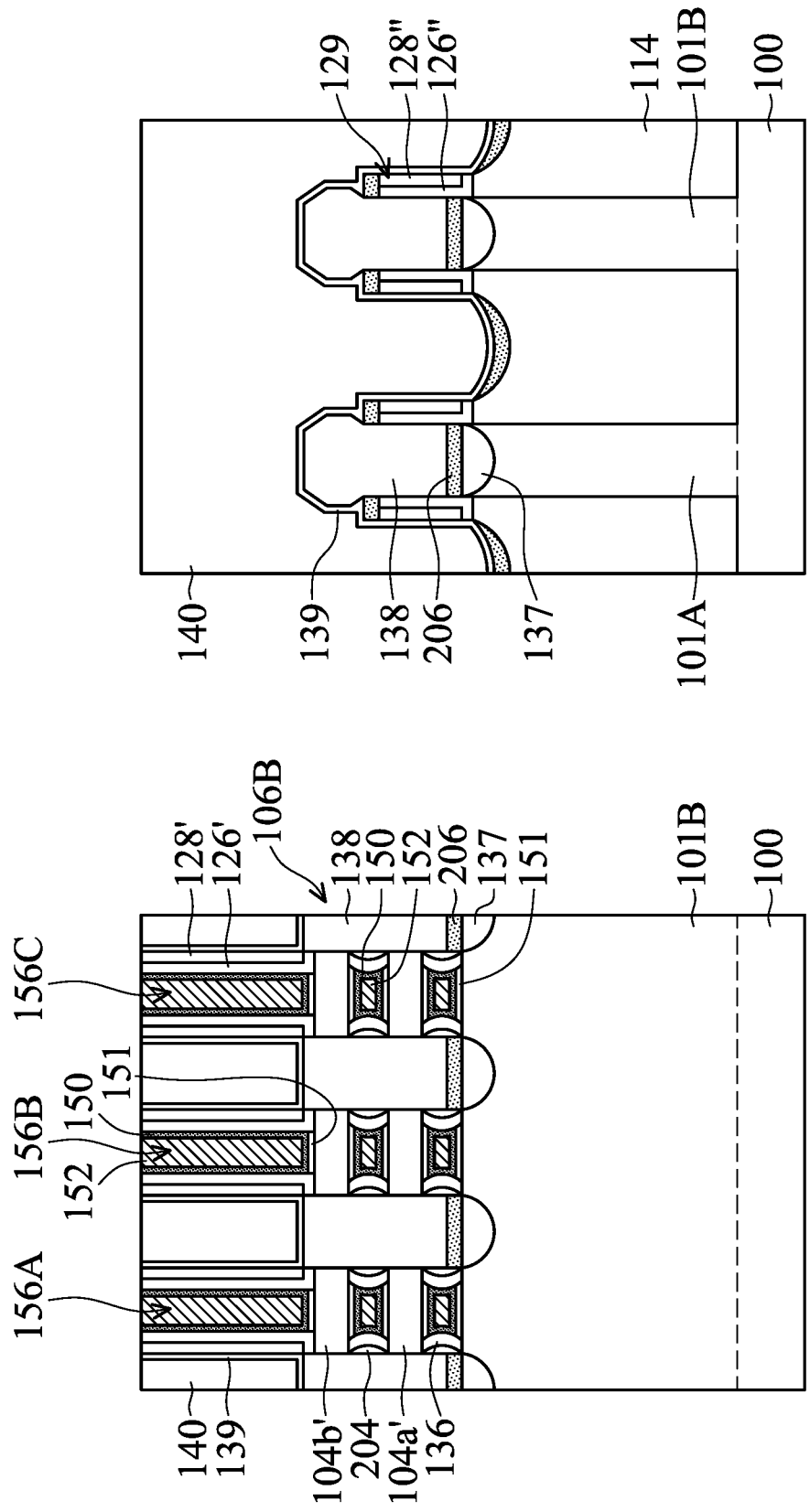

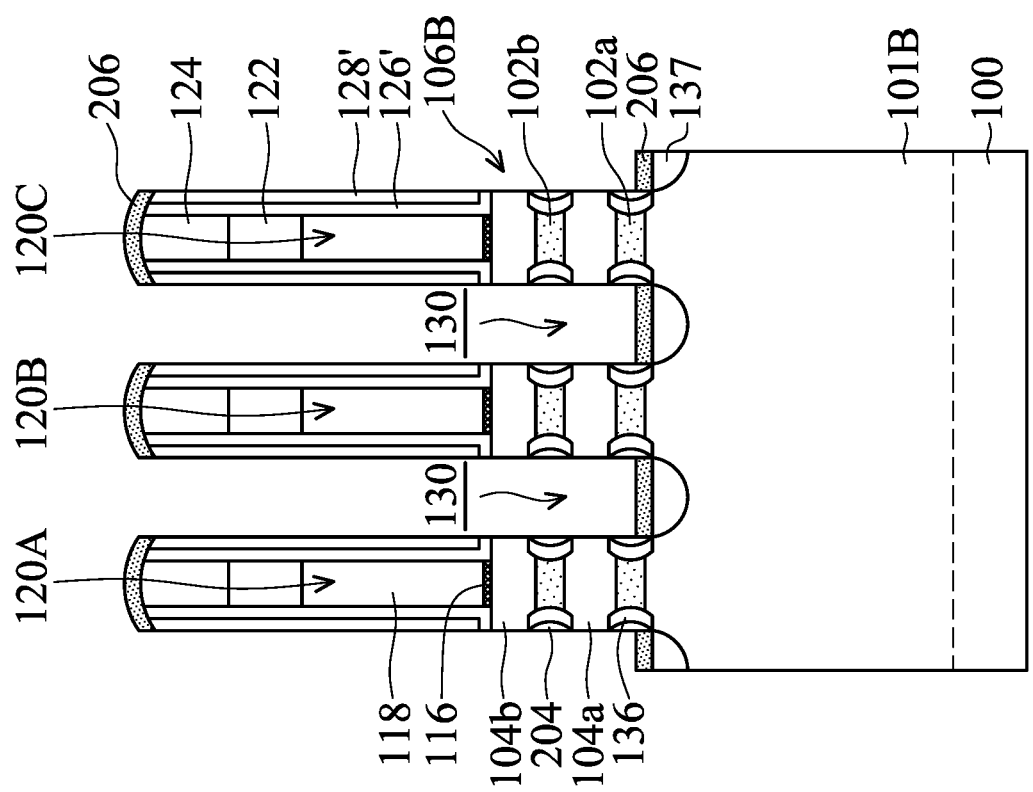
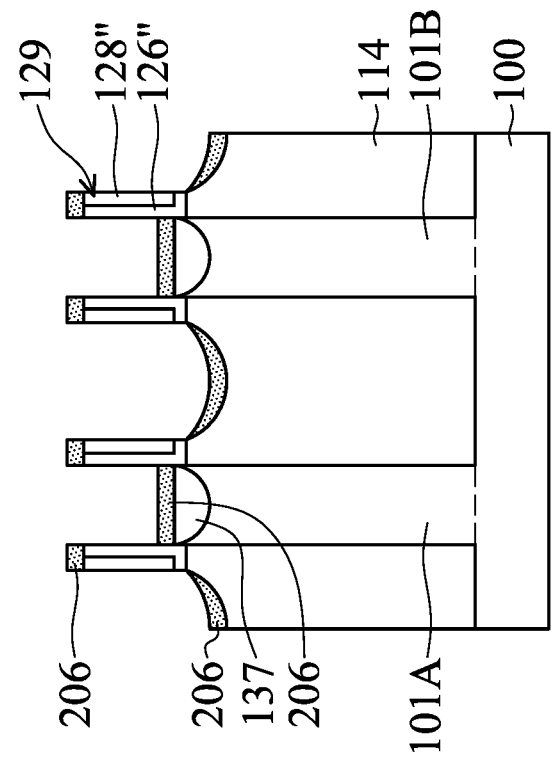
FIG. 3A-1
FIG. 3A-2

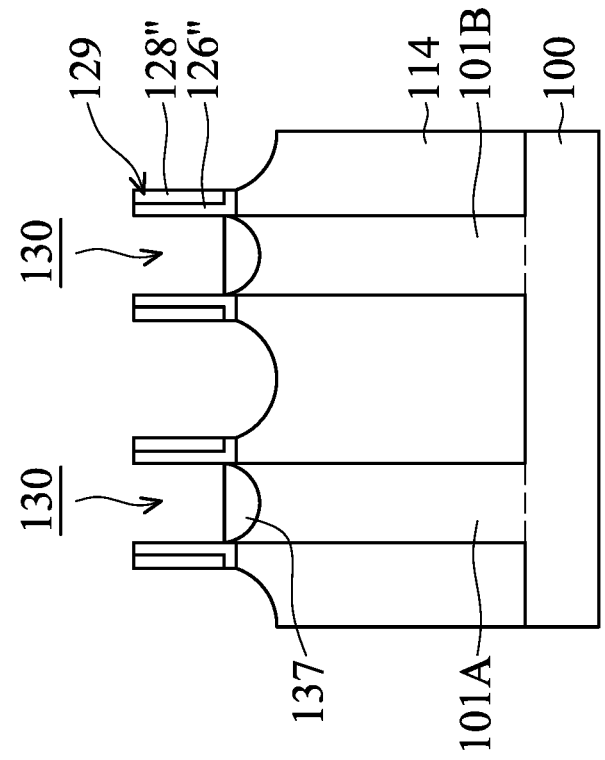
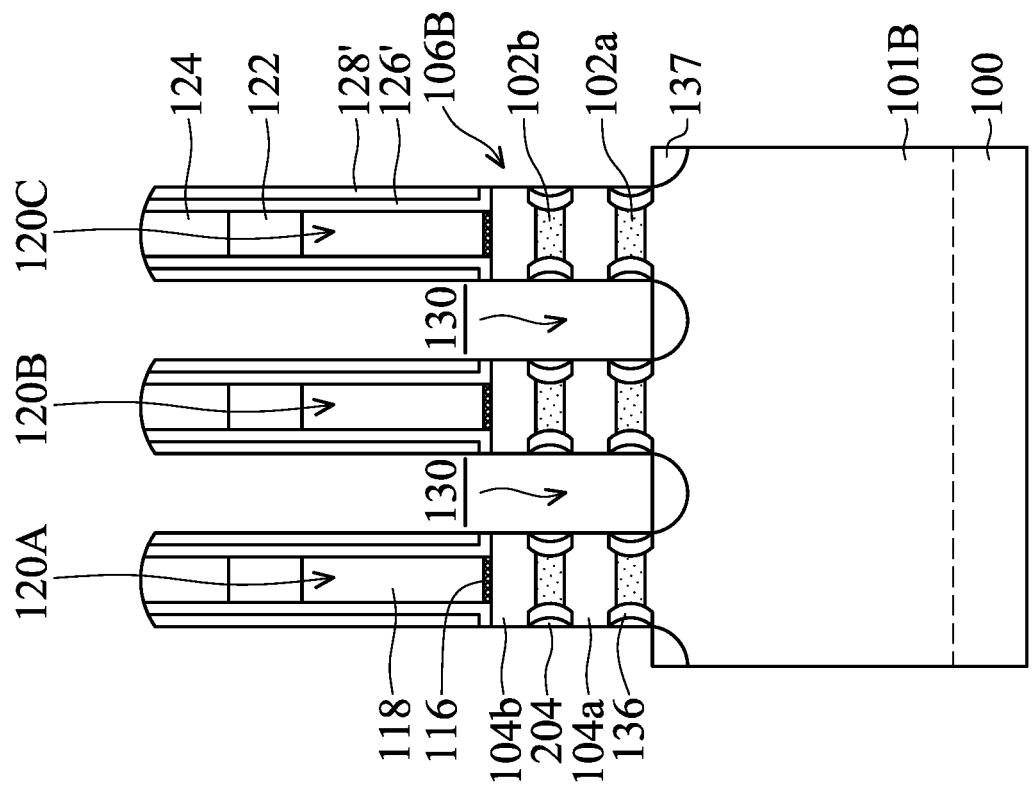
FIG. 3B-2
FIG. 3B-1

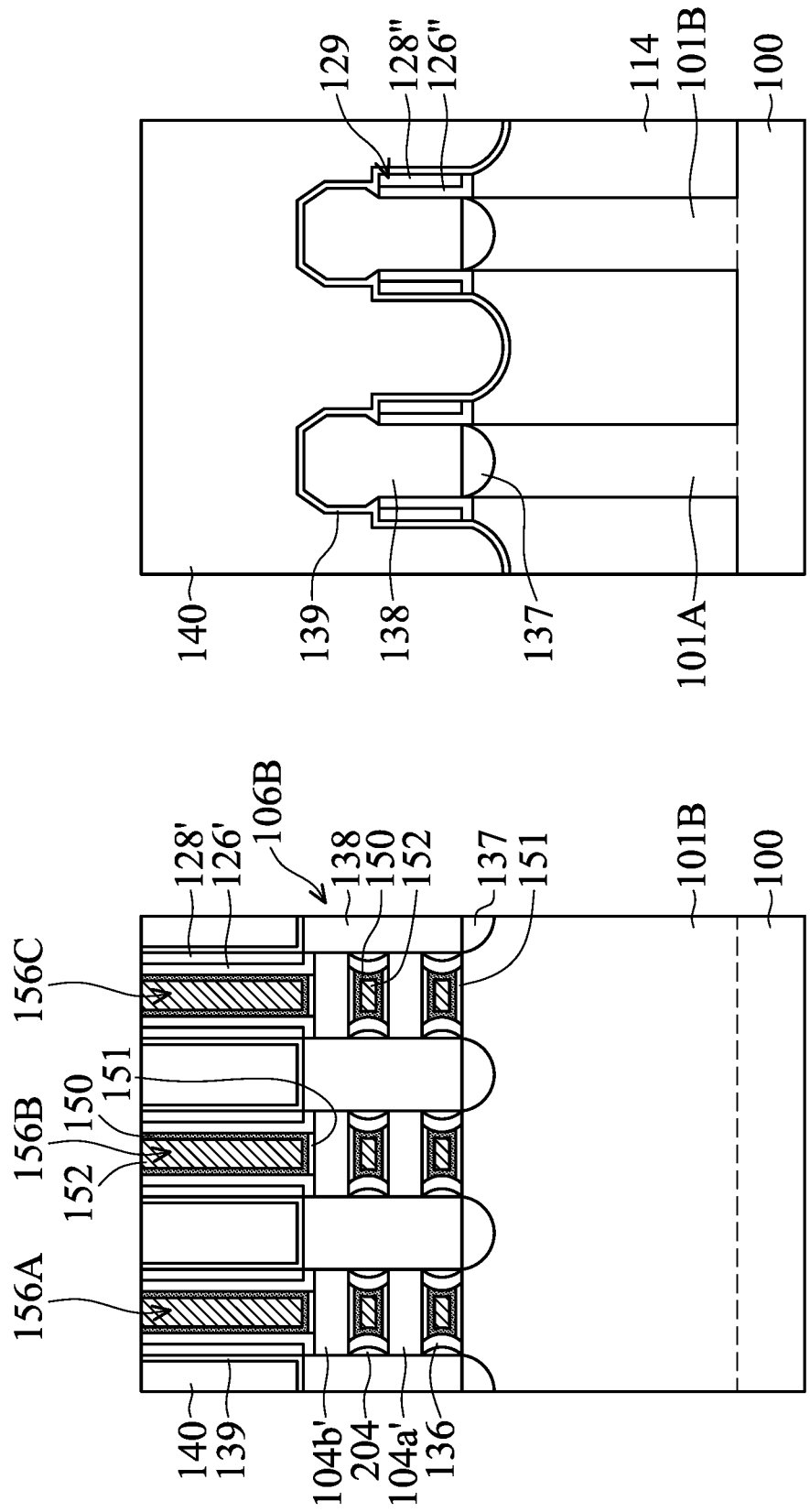

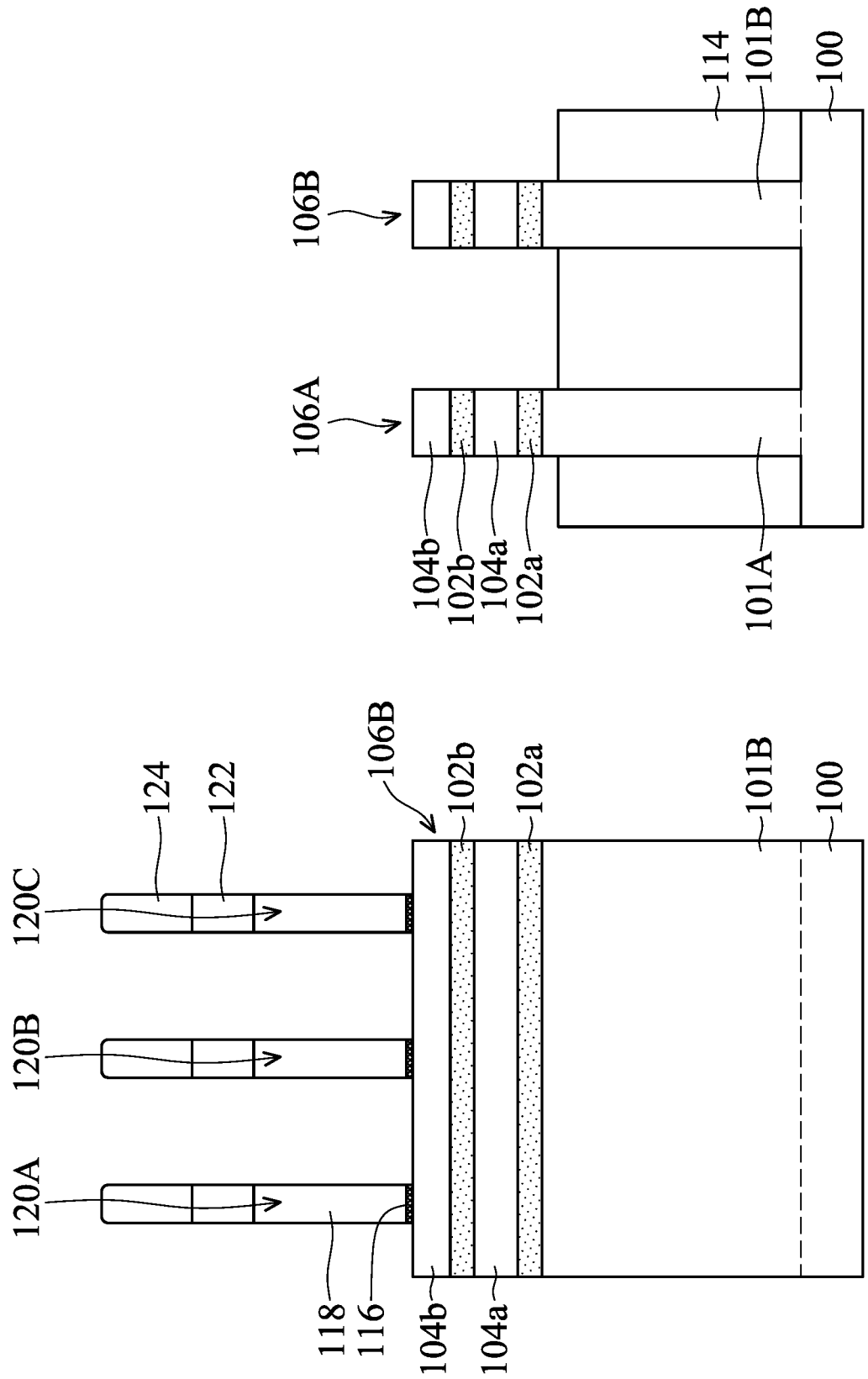

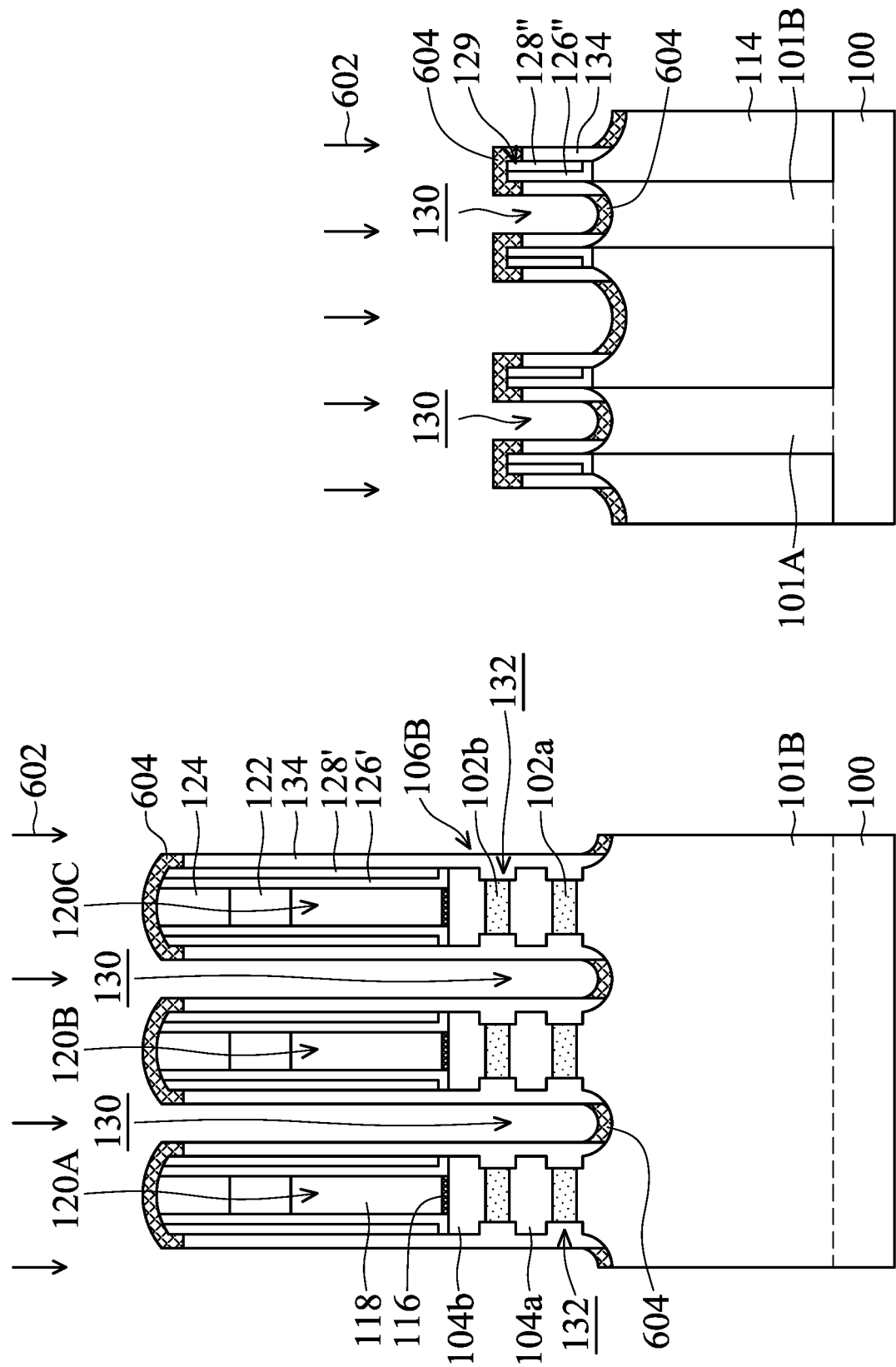

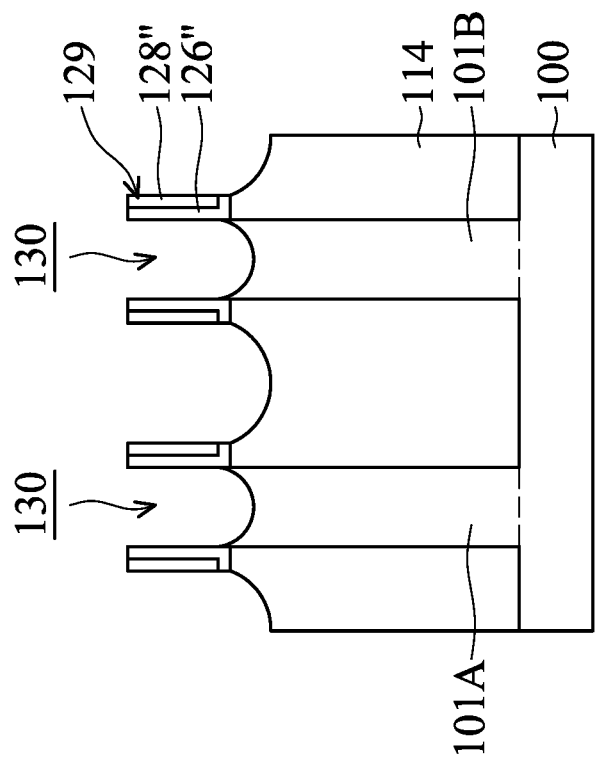
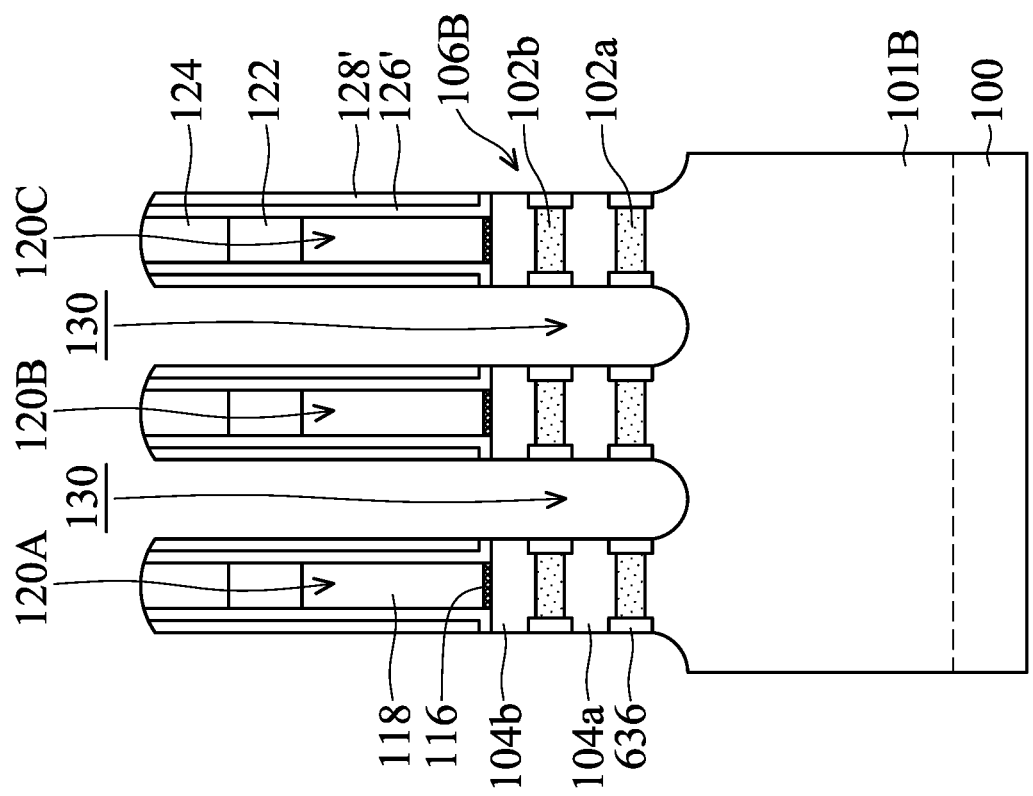
FIG. 6F-2
FIG. 6F-1

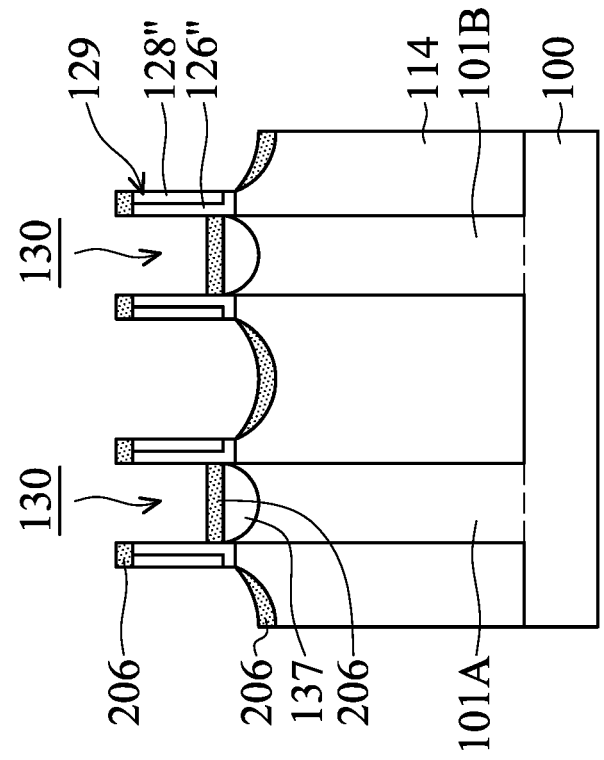
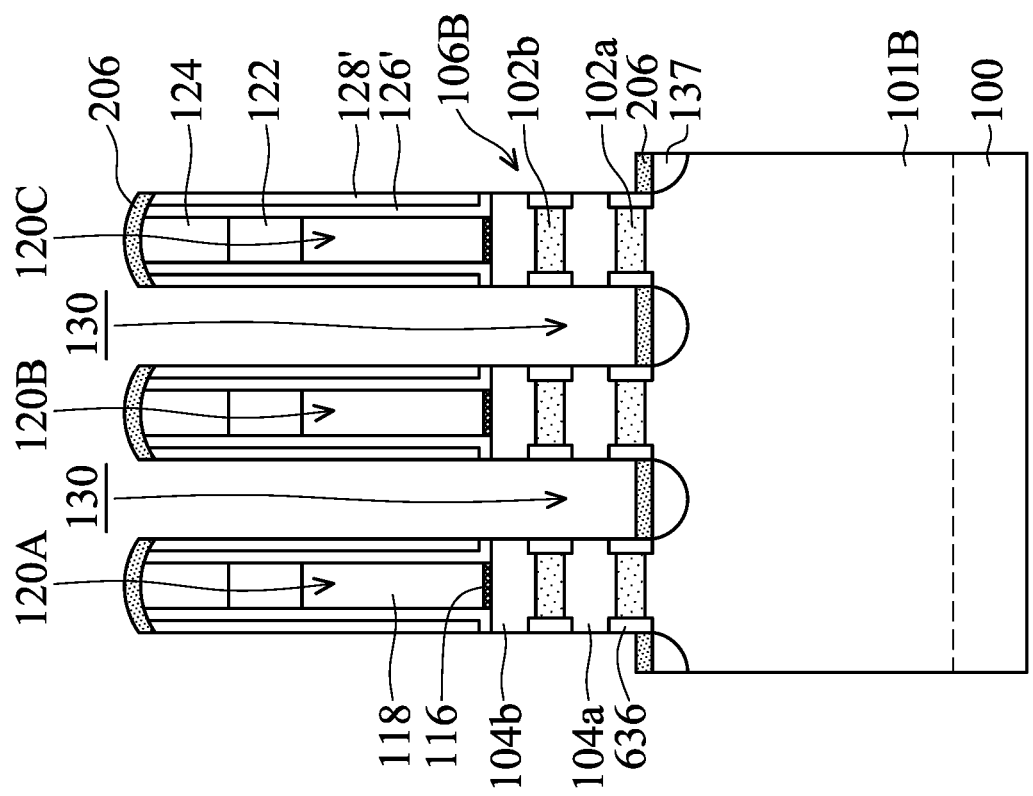
FIG. 6G-2
FIG. 6G-1

STRUCTURE AND FORMATION METHOD OF SEMICONDUCTOR DEVICE WITH EPITAXIAL STRUCTURES

BACKGROUND

The semiconductor integrated circuit (IC) industry has experienced rapid growth. Technological advances in IC materials and design have produced generations of ICs. Each generation has smaller and more complex circuits than the previous generation.

Over the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-1 to 2N-1 are cross-sectional views of various stages of a process for forming a portion of a semiconductor device structure, in accordance with some embodiments.

FIGS. 2A-2 to 2N-2 are cross-sectional views of various stages of a process for forming a portion of a semiconductor device structure, in accordance with some embodiments.

FIGS. 3A-1 to 3D-1 are cross-sectional views of various stages of a process for forming a portion of a semiconductor device structure, in accordance with some embodiments.

FIGS. 3A-2 to 3D-2 are cross-sectional views of various stages of a process for forming a portion of a semiconductor device structure, in accordance with some embodiments.

FIGS. 6A-1 to 6H-1 are cross-sectional views of various stages of a process for forming a portion of a semiconductor device structure, in accordance with some embodiments.

FIGS. 6A-2 to 6H-2 are cross-sectional views of various stages of a process for forming a portion of a semiconductor device structure, in accordance with some embodiments.

DETAILED DESCRIPTION

Figure 1A:
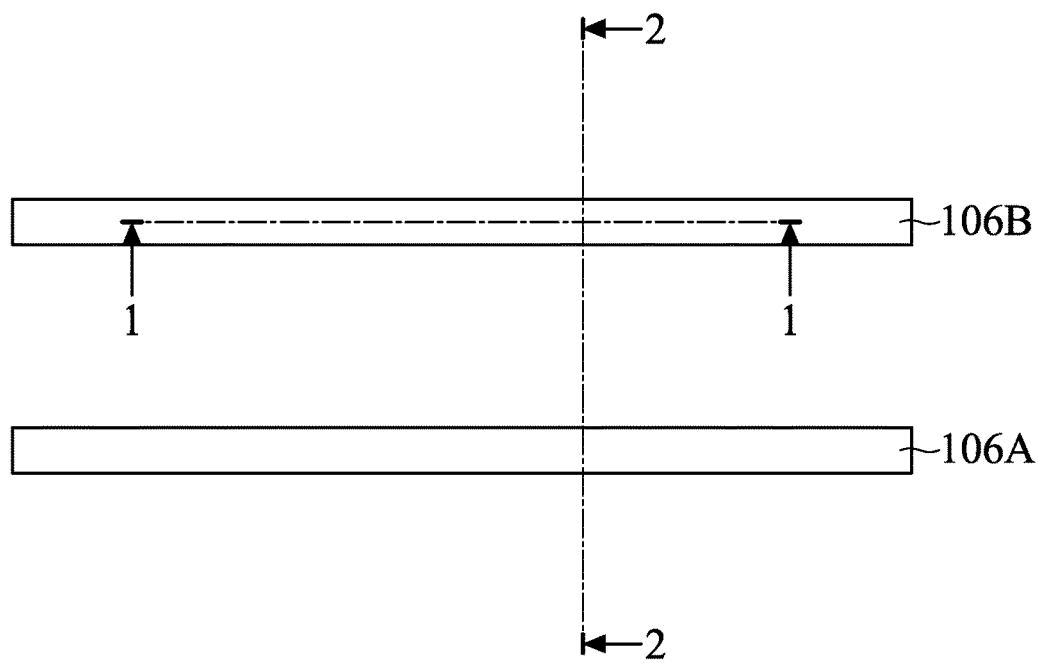
FIGS. 1A-1B are top views of various stages of a process for forming a portion of a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100% of what is specified. Furthermore, terms such as "substantially parallel" or "substantially perpendicular" are to be interpreted as not to exclude insignificant deviation from the specified arrangement and may include for example deviations of up to 10 degrees in some embodiments. The word "substantially" does not exclude "completely" e.g. a composition which is "substantially free" from Y may be completely free from Y in some embodiments.

Terms such as "about" in conjunction with a specific distance or size are to be interpreted so as not to exclude insignificant deviation from the specified distance or size and may include for example deviations of up to 10% of what is specified in some embodiments. The term "about" in relation to a numerical value x may mean x±5 or 10% of what is specified in some embodiments.

Embodiments of the disclosure may relate to FinFET structure having fins. The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using another applicable process.

Embodiments of the disclosure may relate to the gate all around (GAA) transistor structures. The GAA structure may be patterned using any suitable method. For example, the structures may be patterned using one or more photolithography processes, including double-patterning or multi-patterning processes. In some embodiments, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 1B:
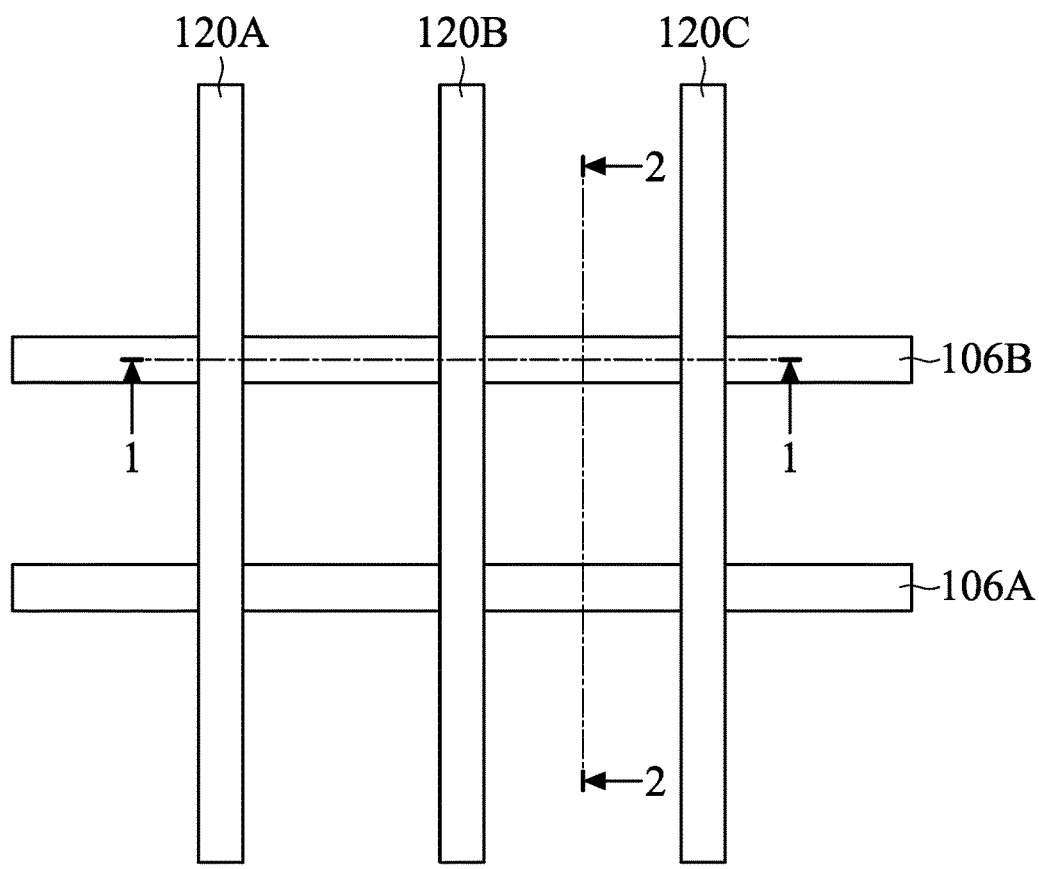
Figures 2, 2G:
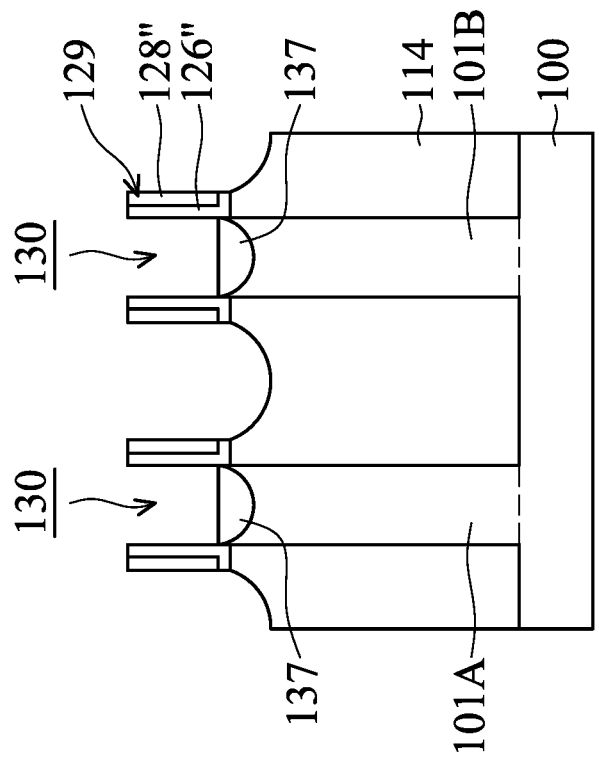
Figures 1, 2G:
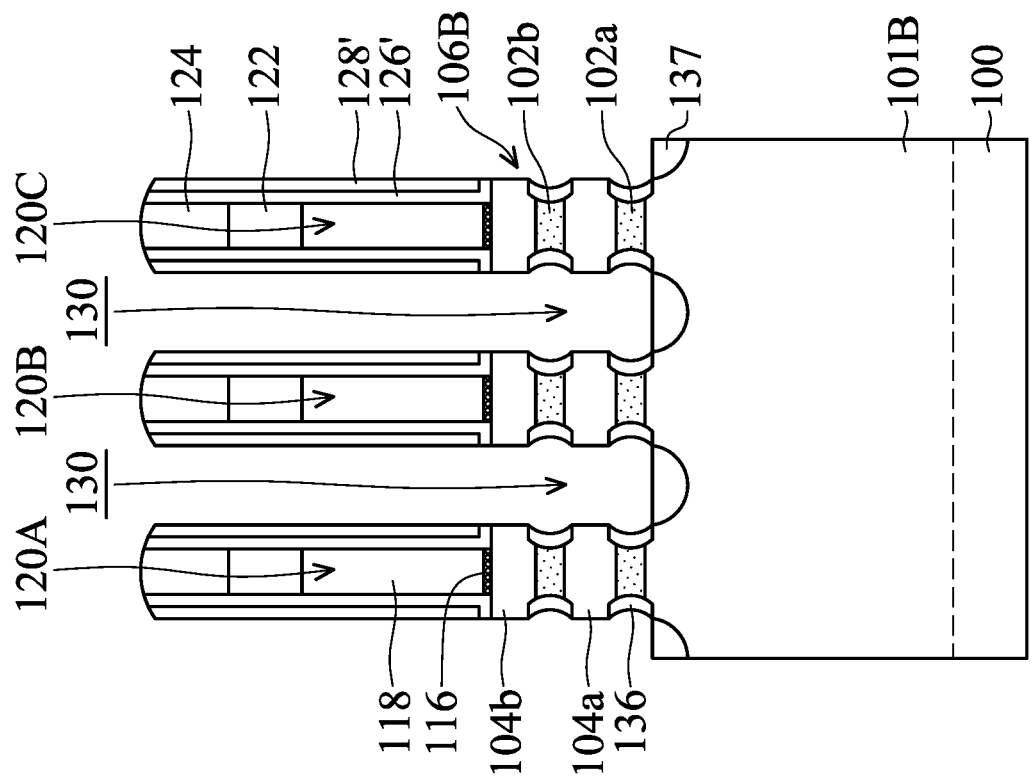

FIGS. 1A-1B are top views of various stages of a process for forming a portion of a semiconductor device structure, in accordance with some embodiments. FIGS. 2A-1 to 2N-1 are cross-sectional views of various stages of a process for forming a portion of a semiconductor device structure, in accordance with some embodiments. FIGS. 2A-2 to 2N-2 are cross-sectional views of various stages of a process for forming a portion of a semiconductor device structure, in accordance with some embodiments.

As shown in FIG. 1A, multiple fin structures 106A and 106B are formed, in accordance with some embodiments. In some embodiments, the fin structures 106A and 106B are oriented lengthwise. In some embodiments, the extending directions of the fin structures 106A and 106B are substantially parallel to each other, as shown in FIG. 1A. In some embodiments, FIG. 2A-1 is a cross-sectional view of the structure taken along the line 1-1 in FIG. 1A. In some embodiments, FIG. 2A-2 is a cross-sectional view of the structure taken along the line 2-2 in FIG. 1A.

As shown in FIGS. 2A-1 and 2A-2, a semiconductor substrate 100 is received or provided. In some embodiments, the semiconductor substrate 100 is a bulk semiconductor substrate, such as a semiconductor wafer. The semiconductor substrate 100 may include silicon or other elementary semiconductor materials such as germanium. The semiconductor substrate 100 may be un-doped or doped (e.g., p-type, n-type, or a combination thereof). In some embodiments, the semiconductor substrate 100 includes an epitaxially grown semiconductor layer on a dielectric layer. The epitaxially grown semiconductor layer may be made of silicon germanium, silicon, germanium, another suitable material, or a combination thereof.

In some other embodiments, the semiconductor substrate 100 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

In some embodiments, a semiconductor stack having multiple semiconductor layers is formed over the semiconductor substrate 100, in accordance with some embodiments. In some embodiments, the semiconductor stack includes multiple semiconductor layers 102a and 102b. The semiconductor stack also includes multiple semiconductor layers 104a and 104b. In some embodiments, the semiconductor layers 102a and 102b and the semiconductor layers 104a and 104b are laid out alternately, as shown in FIGS. 2A-1 and 2A-2. The semiconductor layers 102a and 102b and the semiconductor layers 104a and 104b have an alternating configuration, as shown in FIGS. 2A-1 and 2A-2.

In some embodiments, the semiconductor layers 102a and 102b function as sacrificial layers that will be removed in a subsequent process to release the semiconductor layers 104a and 104b. The semiconductor layers 104a and 104b that are released may function as channel structures of one or more transistors.

In some embodiments, the semiconductor layers 104a and 104b that will be used to form channel structures are made of a material that is different than that of the semiconductor layers 102a and 102b. In some embodiments, the semiconductor layers 104a and 104b are made of or include silicon, germanium, another suitable material, or a combination thereof. In some embodiments, the semiconductor layers 102a and 102b are made of or include silicon germanium. In some other embodiments, the semiconductor layers 104a and 104b are made of silicon germanium, and the semiconductor layers 102a and 102b are made of silicon germanium with different atomic concentration of germanium than that of the semiconductor layers 104a and 104b. As a result, different etching selectivity and/or different oxidation rates during subsequent processing may be achieved between the semiconductor layers 102a-102b and the semiconductor layers 104a-104b.

The present disclosure contemplates that the semiconductor layers 102a and 102b and the semiconductor layers 104a and 104b include any combination of semiconductor materials that can provide desired etching selectivity, desired oxidation rate differences, and/or desired performance characteristics (e.g., materials that maximize current flow).

In some embodiments, the semiconductor layers 102a-102b and 104a-104b are formed using multiple epitaxial growth operations. Each of the semiconductor layers 102a-102b and 104a-104b may be formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, another applicable process, or a combination thereof. In some embodiments, the semiconductor layers 102a-102b and 104a-104b are grown in-situ in the same process chamber. In some embodiments, the growth of the semiconductor layers 102a-102b and 104a-104b are alternately and sequentially performed in the same process chamber to complete the formation of the semiconductor stack. In some embodiments, the vacuum of the process chamber is not broken before the epitaxial growth of the semiconductor stack is accomplished.

Afterwards, hard mask elements are formed over the semiconductor stack to assist in a subsequent patterning of the semiconductor stack. Each of the hard mask elements may include a first mask layer and a second mask layer. The first mask layer and the second mask layer may be made of different materials. One or more photolithography processes and one or more etching processes are used to pattern the semiconductor stack into multiple fin structures 106A and 106B, as shown in FIGS. 1A, 2A-1, and 2A-2.

The fin structures 106A and 106B may be patterned by any suitable method. For example, the fin structures 106A and 106B may be patterned using one or more photolithography processes, including double-patterning or multi-patterning processes. Double-patterning or multi-patterning processes may combine photolithography and self-aligned processes, allowing patterns to be created that have, for example, pitches smaller than what is otherwise obtainable using a single, direct photolithography process.

The semiconductor stack is partially removed to form multiple trenches. Each of the fin structures may include portions of the semiconductor layers 102a-102b and 104a-104b and multiple semiconductor fins 101A and 101B, as shown in FIGS. 2A-1 and 2A-2. The semiconductor substrate 100 may also be partially removed during the etching process that forms the fin structures 106A and 106B. Protruding portions of the semiconductor substrate 100 that remain form the semiconductor fins 101A-101B.

Afterwards, as shown in FIG. 2A-2, an isolation structure 114 is formed to surround lower portions of the fin structures 106A and 106B, in accordance with some embodiments. In some embodiments, one or more dielectric layers are deposited over the fin structures 106A and 106B and the semiconductor substrate 100. The dielectric layers may overfill the trenches between the fin structures 106A and 106B.

The dielectric layers may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, another suitable material, or a combination thereof. The dielectric layers may be deposited using a chemical vapor deposition (CVD) process, a flowable chemical vapor deposition (FCVD) process, an atomic layer deposition (ALD) process, another applicable process, or a combination thereof.

Afterwards, a planarization process is used to partially remove the dielectric layers. The hard mask elements (including the first mask layer and the second mask layer) used for forming the fin structures 106A-106B may also function as a stop layer of the planarization process. The planarization process may include a chemical mechanical polishing (CMP) process, a grinding process, a dry polishing process, an etching process, another applicable process, or a combination thereof.

Afterwards, one or more etching back processes are used to partially remove the dielectric layers. As a result, the remaining portion of the dielectric layers forms the isolation structure 114. Upper portions of the fin structures 106A and 106B protrude from the top surface of the isolation structure 114, as shown in FIG. 2A-2.

In some embodiments, the etching back process for forming the isolation structure 114 is carefully controlled to ensure that the topmost surface of the isolation structure 114 is positioned at a suitable height level, as shown in FIG. 2A-2. In some embodiments, the topmost surface of the isolation structure 114 is below the bottommost surface of the semiconductor layer 102a that functions as a sacrificial layer.

Afterwards, the hard mask elements (including the first mask layer and the second mask layer) are removed. Alternatively, in some other embodiments, the hard mask elements are removed or consumed during the planarization process and/or the etching back process that forms the isolation structure 114.

Afterwards, dummy gate stacks 120A, 120B, and 120C are formed to extend across the fin structures 106A and 106B, as shown in FIGS. 1B and 2B-1 in accordance with some embodiments. In some embodiments, FIG. 2B-2 is a cross-sectional view of the structure taken along the line 2-2 in FIG. 1B. The fin structures 106A and 106B are exposed without being covered by the dummy gate stacks 120A-120C. As shown in FIGS. 1B and 2B-1, the dummy gate stacks 120A-120C are formed to partially cover and to extend across the fin structures 106A and 106B, in accordance with some embodiments. In some embodiments, the dummy gate stacks 120A-120C are wrapped around the fin structures 106A and 106B.

As shown in FIG. 2B-1, each of the dummy gate stacks 120A-120C includes a dummy gate dielectric layer 116 and a dummy gate electrode 118. The dummy gate dielectric layers 116 may be made of or include silicon oxide or another suitable material. The dummy gate electrodes 118 may be made of or include polysilicon or another suitable material.

In some embodiments, a dummy gate dielectric material layer and a dummy gate electrode layer are sequentially deposited over the isolation structure 114 and the fin structures 106A and 106B. The dummy gate dielectric material layer may be deposited using an ALD process, a CVD process, another applicable process, or a combination thereof. The dummy gate electrode layer may be deposited using a CVD process. Afterwards, the dummy gate dielectric material layer and the dummy gate electrode layer are patterned to form the dummy gate stacks 120A-120C.

In some embodiments, hard mask elements including mask layers 122 and 124 are used to assist in the patterning process for forming the dummy gate stacks 120A-120C. With the hard mask elements as an etching mask, one or more etching processes are used to partially remove the dummy gate dielectric material layer and the dummy gate electrode layer. As a result, remaining portions of the dummy gate dielectric material layer and the dummy gate electrode layer form the dummy gate dielectric layers 116 and the dummy gate electrodes 118, respectively. As a result, the dummy gate stacks 120A-120C are formed.

As shown in FIGS. 2C-1 and 2C-2, spacer layers 126 and 128 are then deposited over the dummy gate stacks 120A-120C and the fin structures 106A-106B, in accordance with some embodiments. The spacer layers 126 and 128 extend along the tops and sidewalls of the dummy gate stacks 120A-120C and the fin structures 106A-106B, as shown in FIGS. 2C-1 and 2C-2.

In some embodiments, the spacer layers 126 and 128 are made of different materials. The spacer layer 126 may be made of a dielectric material that has a low dielectric constant. The spacer layer 126 may be made of or include silicon carbide, silicon oxycarbide, carbon-containing silicon oxynitride, silicon oxide, another suitable material, or a combination thereof. In some embodiments, the spacer layer 126 is a single layer. In some other embodiments, the spacer layer 126 includes multiple sub-layers. Some of the sub-layers may be made of different materials. Some of the sub-layers may be made of similar materials with different compositions. For example, one of the sub-layers may have a greater atomic concentration of carbon than other sub-layers.

The spacer layer 128 may be made of a dielectric material that can provide more protection to the gate stacks during subsequent processes. The spacer layer 128 may have a greater dielectric constant than that of the spacer layer 126. The spacer layer 128 may be made of silicon nitride, silicon oxynitride, carbon-containing silicon nitride, carbon-containing silicon oxynitride, another suitable material, or a combination thereof. The spacer layers 126 and 128 may be sequentially deposited using a CVD process, an ALD process, a physical vapor deposition (PVD) process, another applicable process, or a combination thereof.

However, embodiments of the disclosure are not limited thereto. Many variations and/or modifications can be made to embodiments of the disclosure. In some other embodiments, the spacer layers 126 and 128 are made of the same material.

As shown in FIGS. 2D-1 and 2D-2, the spacer layers 126 and 128 are partially removed, in accordance with some embodiments. One or more anisotropic etching processes may be used to partially remove the spacer layers 126 and 128. As a result, first remaining portions of the spacer layers 126 and 128 form gate spacers 126' and 128', respectively. The gate spacers 126' and 128' together form gate spacer structures. The gate spacers 126' and 128' extend along the sidewalls of the dummy gate stacks 120A-120C, as shown in FIG. 2D-1. In some embodiments, second remaining portions of the spacer layers 126 and 128 form spacers 126" and 128", respectively. The spacers 126" and 128" together form spacer structures 129, as shown in FIG. 2D-2. In some embodiments, the spacer structures 129 and the gate spacer structures are made of the same material.

In some embodiments, the fin structures 106A-106B are partially removed, in accordance with some embodiments. As a result, the recesses 130 are formed, as shown in FIGS. 2D-1 and 2D-2. The recesses 130 may be used to contain epitaxial structures (such as source/drain structures) that will be formed later. One or more etching processes may be used to form the recesses 130. In some embodiments, a dry etching process is used to form the recesses 130. Alternatively, a wet etching process may be used to form the recesses 130.

In some embodiments, the recesses 130 penetrate into the fin structures 106A-106B. In some embodiments, the recesses 130 further extend into the semiconductor fins 101A and 101B, as shown in FIGS. 2D-1 and 2D-2. In some embodiments, the gate spacers 126' and 128', the spacer structures 129, and the recesses 130 are formed simultaneously using the same etching process.

Afterwards, as shown in FIG. 2E-1, the semiconductor layers 102a and 102b are partially removed, in accordance with some embodiments. The semiconductor layers 102a and 102b may be laterally etched from the exposed side surfaces. As a result, edges of the semiconductor layers 102a and 102b retreat from edges of the semiconductor layers 104a and 104b.

As shown in FIG. 2E-1, recesses 132 are formed due to the lateral etching of the semiconductor layers 102a and 102b. The recesses 132 may be used to contain inner spacers that will be formed later. The semiconductor layers 102a and 102b may be laterally etched using a wet etching process, a dry etching process, or a combination thereof. In some other embodiments, the semiconductor layers 102a and 102b are partially oxidized before being laterally etched.

As shown in FIGS. 2E-1 and 2E-2, an inner spacer layer 134 is deposited over the dummy gate stacks 120A-120C and the fin structures 106A-106B, in accordance with some embodiments. The inner spacer layer 134 covers the dummy gate stacks 120A-120C and fills the recesses 132. The inner spacer layer 134 further extends over the spacer structures 129 and the semiconductor fins 101A and 101B.

The inner spacer layer 134 may be made of or include carbon-containing silicon nitride (SiCN), carbon-containing silicon oxynitride (SiOCN), carbon-containing silicon oxide (SiOC), silicon oxide, silicon nitride, another suitable material, or a combination thereof. In some embodiments, the inner spacer layer 134 is a single layer. The inner spacer layer 134 may be deposited using a CVD process, an ALD process, another applicable process, or a combination thereof.

As shown in FIGS. 2F-1 and 2F-2, an etching process is used to partially remove the inner spacer layer 134, in accordance with some embodiments. The portions of the inner spacer layer 134 that are outside of the recesses 132 may be removed, as shown in FIGS. 2F-1 and 2F-2. The remaining portions of the inner spacer layer 134 form inner spacers 136, as shown in FIG. 2F-1.

In some embodiments, the etching process is an isotropic etching process. The etching process may include a dry etching process, a wet etching process, or a combination thereof. The etching process may be carefully controlled so that it does not substantially etch the gate spacers 126' and 128' or the spacer structures 129. The spacer structures 129 may thus have sufficient height, which facilitates the subsequent formation of epitaxial structures. The nearby epitaxial structures may be prevented from being merged together due to the spacer structures 129.

The inner spacers 136 cover the edges of the semiconductor layers 102a and 102b. The inner spacers 136 may be used to prevent subsequently formed epitaxial structures (that function as, for example, source/drain structures) from being damaged during a subsequent process for removing the semiconductor layers 102a and 102b. As mentioned above, in some embodiments, the inner spacer layer 134 is partially removed using an isotropic etching process. The laterally etch of the inner spacer layer 134 may thus be minimized. The dishing degree of the inner spacers 136 may thus be minimized, which ensures the quality of the inner spacers 136. The risk of short circuiting between the gate electrode and the source/drain structures is substantially reduced.

In some embodiments, the inner spacers 136 are made of a low-k material that has a lower dielectric constant than that of silicon oxide. In these cases, the inner spacers 136 may also be used to reduce parasitic capacitance between the subsequently formed source/drain structures and the gate stacks. As a result, the operation speed of the semiconductor device structure may be improved.

In some embodiments, after the etching process for forming the inner spacers 136, portions of the semiconductor fin 101A and 101B that are originally covered by the inner spacer layer 134 are exposed by the recesses 130, as shown in FIGS. 2F-1 and 2F-2. The edges of the semiconductor layers 104a and 104b are also exposed by the recesses 130, as shown in FIG. 2F-1.

As shown in FIGS. 2G-1 and 2G-2, semiconductor isolation structures 137 are formed over the bottoms of the recesses 130, in accordance with some embodiments. In some embodiments, the semiconductor isolation structures 137 are epitaxial structures that are undoped. In some embodiments, the semiconductor isolation structures 137 are substantially free of n-type dopants or p-type dopants.

The semiconductor isolation structures 137 may be made of or include silicon, silicon germanium, another suitable material, or a combination thereof. The semiconductor isolation structures 137 may be formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, another applicable process, or a combination thereof.

In some embodiments, the semiconductor isolation structures 137 are formed to have substantially planar top surfaces, as shown in FIGS. 2G-1 and 2G-2. In some embodiments, the top surfaces of the semiconductor isolation structures 137 are positioned at a height level that is lower than the bottom surface of the semiconductor layer 104a. In some embodiments, the top surfaces of the semiconductor isolation structures 137 and the top surface of the semiconductor fin 101B are substantially level, as shown in FIG. 2G-1. In some embodiments, the semiconductor isolation structures 137 are in direct contact with the spacer structures 129, as shown in FIG. 2G-2.

As shown in FIGS. 2H-1 and 2H-2, a second inner spacer layer 202 is deposited over the dummy gate stacks 120A-120C, the inner spacers 136, and the spacer structures 129, in accordance with some embodiments. The second inner spacer layer 202 covers the dummy gate stacks 120A-120C and fills the recesses of the inner spacers 136. The second inner spacer layer 202 further extends over the semiconductor isolation structures 137 and the isolation structure 114.

The second inner spacer layer 202 may be made of or include carbon-containing silicon nitride (SiCN), carbon-containing silicon oxynitride (SiOCN), carbon-containing silicon oxide (SiOC), silicon oxide, silicon nitride, another suitable material, or a combination thereof. In some embodiments, the second inner spacer layer 202 is a single layer. In some embodiments, the second inner spacer layer 202 includes multiple sub-layers. The second inner spacer layer 202 may be deposited using a CVD process, an ALD process, another applicable process, or a combination thereof.

As shown in FIGS. 2I-1 and 2I-2, an etching process is used to partially remove the second inner spacer layer 202, in accordance with some embodiments. The portions of the second inner spacer layer 202 that are outside of the recesses of the inner spacers 136 may be removed, as shown in FIGS. 2I-1 and 2I-2. The remaining portions of the second inner spacer layer 202 form second inner spacers 204, as shown in FIG. 2I-1.

In some embodiments, the etching process is an isotropic etching process. The etching process may include a dry etching process, a wet etching process, or a combination thereof. The etching process may be carefully controlled so that it does not substantially etch the gate spacers 126' and 128' or the spacer structures 129. As shown in FIG. 2I-1, the spacer structures 129 may thus have sufficient height, which facilitates the subsequent formation of epitaxial structures. The nearby epitaxial structures may be prevented from being merged together due to the spacer structures 129.

The second inner spacers 204 cover the edges of the inner spacers 136. The second inner spacers 204 and 136 may together be used to prevent subsequently formed epitaxial structures (that function as, for example, source/drain structures) from being damaged during a subsequent process for removing the semiconductor layers 102a and 102b. As mentioned above, in some embodiments, the second inner spacer layer 202 is partially removed using an isotropic etching process. The laterally etch of the second inner spacer layer 202 may thus be minimized. The dishing degree of the second inner spacers 204 may thus be minimized, which ensures the quality of the second inner spacers 204. In some embodiments, the edges of the second inner spacers 204 are aligned with the edges of the semiconductor layers 104a and 104b, as shown in FIG. 2I-1. The risk of short circuiting between the gate electrode and the source/drain structures is substantially reduced.

In some embodiments, the second inner spacers 204 are made of a low-k material that has a lower dielectric constant than that of silicon oxide. In these cases, the second inner spacers 204 may also be used to reduce parasitic capacitance between the subsequently formed source/drain structures and the gate stacks. As a result, the operation speed of the semiconductor device structure may be improved.

In some embodiments, after the etching process for forming the second inner spacers 204, the semiconductor isolation structures 137 that are originally covered by the second inner spacer layer 202 are exposed by the recesses 130, as shown in FIGS. 2I-1 and 2I-2. The edges of the semiconductor layers 104a and 104b are also exposed by the recesses 130, as shown in FIG. 2I-1.

Figures 2, 2J:
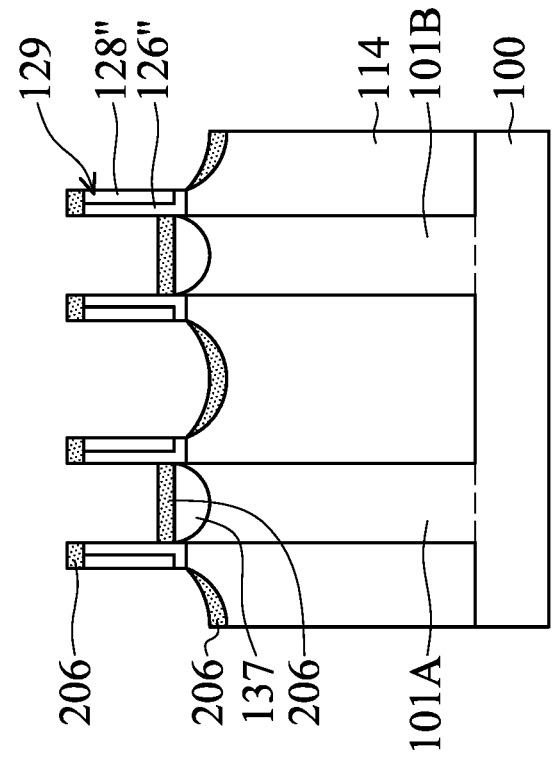
Figures 1, 2J:
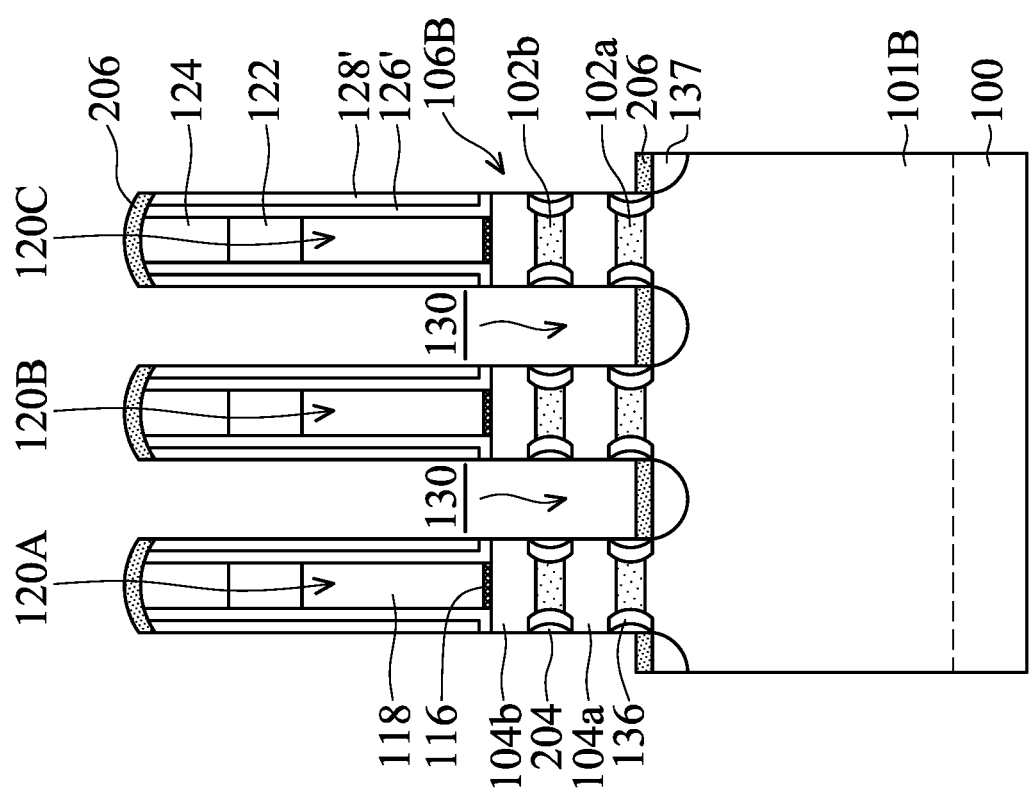

As shown in FIGS. 2J-1 and 2J-2, isolation films 206 are formed over the tops of the semiconductor isolation structures 137, the spacer structures 129, the isolation structure 114, and the dummy gate stacks 120A-120C, in accordance with some embodiments. The isolation films 206 may help to prevent or minimize the bulk substrate leakage and well isolation leakage. In some embodiments, the isolation films 206 covers the tops of the semiconductor isolation structures 137, the spacer structures 129, the isolation structure 114, and the dummy gate stacks 120A-120C. In some embodiments, the isolation films 206 do not cover the sidewalls of the spacer structures 129 and the dummy gate stacks 120A-120C, as shown in FIGS. 2J-1 and 2J-2. In some embodiments, the isolation films 206 are in direct contact with the semiconductor isolation structures 137 and some of the second inner spacers 204. In some embodiments, the spacer structures 129 extend across the bottom surfaces of the isolation films 206 and the top surfaces of the isolation films 206, as shown in FIG. 2J-2.

As mentioned above, in some embodiments, the semiconductor isolation structures 137 have substantially planar top surfaces. The planar top surfaces of the semiconductor isolation structures 137 may facilitate the formation of the isolation films 206. As a result, better uniformity control of the isolation films 206 is achieved. The semiconductor isolation structures 137 and the isolation films 206 may thus together suppress the bottom substrate leakage. The performance and reliability of the semiconductor device structure are greatly improved.

The isolation films 206 may be made of or include carbon-containing silicon nitride (SiCN), carbon-containing silicon oxynitride (SiOCN), carbon-containing silicon oxide (SiOC), silicon oxide, silicon nitride, another suitable material, or a combination thereof. In some embodiments, each of the isolation films 206 is a single layer. In some other embodiments, each of the isolation films 206 includes multiple sub-layers.

The isolation films 206 may be deposited using a CVD process, a plasma-enhanced chemical vapor deposition (PECVD) process, an ALD process, another applicable process, or a combination thereof. In some embodiments, the formation of the isolation films 206 involves introducing plasma, which may help to prevent the isolation films 206 from being formed on the sidewalls of the dummy gate stacks 120A-120C, the spacer structures 129, the semiconductor layers 104a-104b, and the second inner spacers 204.

As shown in FIGS. 2K-1 and 2K-2, epitaxial structures 138 are formed in the recesses 130, in accordance with some embodiments. In some embodiments, one or more semiconductor materials are directly grown on the side surfaces of the semiconductor layers 104a and 104b. As a result, the semiconductor material forms the epitaxial structures 138. In some embodiments, the epitaxial structures 138 are in direct contact with the isolation films 206. In some embodiments, the epitaxial structures 138 overfill the recesses 130 to ensure fully contact between the epitaxial structures 138 and the semiconductor layers 104a-104b. In some embodiments, the top surfaces of the epitaxial structures 138 are higher than the top surface of the dummy gate dielectric layer 116.

In some embodiments, the epitaxial structures 138 connect to the semiconductor layers 104a and 104b. Portions of the semiconductor layers 104a and 104b that will be function as channel structures are sandwiched between two respective epitaxial structures 138, as shown in FIGS. 2K-1 and 2K-2. In some embodiments, the epitaxial structures 138 are designed to function as source/drain structures of p-channel field-effect transistors (PFET). The epitaxial structures 138 may include epitaxially grown silicon germanium (SiGe), epitaxially grown silicon, or another suitable epitaxially grown semiconductor material. In some embodiments, the epitaxial structures 138 are doped with one or more suitable p-type dopants. For example, the epitaxial structures 138 are SiGe source/drain features or Si source/drain features that are doped with boron (B), gallium (Ga), indium (In), or another suitable dopant.

In some other embodiments, the epitaxial structures 138 are designed to function as source/drain structures of n-channel field-effect transistors (NFET). The epitaxial structures 138 may include epitaxially grown silicon or another suitable epitaxially grown semiconductor material. The epitaxial structures 138 are n-type doped. In some embodiments, the epitaxial structures 138 are doped with one or more suitable n-type dopants. For example, the epitaxial structures 138 are Si source/drain features that are doped with phosphor (P), antimony (Sb), arsenic (As), or another suitable dopant.

The term "source/drain structure" may refer to a source structure or a drain structure, individually or collectively, depending on the context.

In some embodiments, the epitaxial structures 138 are formed using multiple epitaxial growth operations. In some embodiments, these epitaxial growth operations are performed in-situ in the same process chamber. In some embodiments, the vacuum of the process chamber is not broken before the formation of the epitaxial structures 138 is accomplished. The reaction gases may be varied in the reaction chamber during the epitaxial growth operations.

These epitaxial growth operations may be achieved using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof. In some embodiments, the formation of the epitaxial structures 138 involves one or more etching processes that are used to fine-tune the shapes of the epitaxial structures 138.

In some embodiments, the epitaxial structures 138 are doped in-situ during their epitaxial growth. The initial reaction gas mixture for forming the epitaxial structures 138 contains respective dopants. In some embodiments, the epitaxial structures 138 are further exposed to one or more annealing processes to activate the dopants. For example, a rapid thermal annealing process is used. During the one or more annealing processes, the sacrificial structure 210' remains stable.

The spacer structures 129 may confine the growth of the epitaxial structures 138, so as to form the epitaxial structures 138 with desired profiles. As shown in FIG. 2K-1, due to the confine of the spacer structures 129, the epitaxial structures 138 that are positioned nearby are prevented from being merged together.

As mentioned above, the etching processes used for forming the inner spacers 136 and 204 are isotropic etching processes that substantially do not etch the gate spacers 126' and 128' and the spacer structures 129. The spacer structures 129 may substantially remain after these isotropic etching processes. Therefore, each of the spacer structures 129 may have a height h that is sufficient to confine the growth of the epitaxial structures 138, as shown in FIG. 2K-2. The height h of the spacer structures 129 may be within a range from about 10 nm to about 30 nm. As shown in FIG. 2K-2, each of the epitaxial structures 138 has a height H. The height H of the epitaxial structures 138 may be within a range from about 20 nm to about 45 nm. In some of the embodiments, more stacked channel structures (such as a three nanosheets structure) are to be formed beside each of the epitaxial structures 138. The height H may be within a range from about 35 nm to about 60 nm.

The ratio (h/H) of the height h to the height H may be within a range from about 0.15 to about 0.6. In some cases, if the ratio (h/H) is smaller than about 0.15, the height h may be too small. The spacer structures 129 may not be able to confine the growth of the epitaxial structures 138. The epitaxial structures 138 that are positioned nearby may be merged together. In some other cases, if the ratio (h/H) is greater than about 0.6, the growth of the epitaxial structures 138 may be confined too much. The epitaxial structures 138 may thus have insufficient width, which may also not be desired. Many variations and/or modifications can be made to embodiments of the disclosure. In some other embodiments, the ratio (h/H) of the height h to the height H is within a range from about 0.2 to about 0.5.

As shown in FIGS. 2L-1 and 2L-2, a contact etch stop layer 139 and a dielectric layer 140 are then formed to surround the epitaxial structures 138, the dummy gate stacks 120A-120C, and the spacer structures 129, in accordance with some embodiments. The contact etch stop layer 139 may be made of or include silicon nitride, silicon oxynitride, silicon carbide, aluminum oxide, another suitable material, or a combination thereof. The dielectric layer 140 may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, another suitable material, or a combination thereof.

In some embodiments, an etch stop material layer and a dielectric material layer are sequentially deposited. The etch stop material layer may be deposited using a CVD process, an ALD process, a PVD process, another applicable process, or a combination thereof. The dielectric material layer may be deposited using an FCVD process, a CVD process, an ALD process, another applicable process, or a combination thereof.

Afterwards, a planarization process is used to partially remove the etch stop material layer and the dielectric material layer. As a result, the remaining portions of the etch stop material layer and the dielectric material layer respectively form the contact etch stop layer 139 and the dielectric layer 140, as shown in FIGS. 2L-1 and 2L-2. The planarization process may include a CMP process, a grinding process, an etching process, a dry polishing process, another applicable process, or a combination thereof. In some embodiments, the mask layers 122 and 124 and the isolation films 206 on the mask layer 124 are also removed during the planarization process. In some embodiments, after the planarization process, the top surfaces of the contact etch stop layer 139, the dielectric layer 140, and the dummy gate electrodes 118 are substantially level.

Afterwards, the dummy gate electrodes 118 are removed to form trenches 142 using one or more etching processes, in accordance with some embodiments. The trenches 142 are surrounded by the dielectric layer 140. The trenches 142 may expose the dummy gate dielectric layer 116.

Afterwards, as shown in FIG. 2M-1, the dummy gate dielectric layer 116 and the semiconductor layers 102a and 102b (that function as sacrificial layers) are removed, in accordance with some embodiments. In some embodiments, one or more etching processes are used to remove the dummy gate dielectric layer 116 and the semiconductor layers 102a and 102b. As a result, recesses 144 are formed, as shown in FIG. 2M-1. As shown in FIG. 2M-2, the dielectric layer 140 protects the epitaxial structures 138 thereunder during the formation of the trenches 142 and the recesses 144.

Due to high etching selectivity, the semiconductor layers 104a and 104b are slightly (or substantially not) etched. The remaining portions of the semiconductor layers 104a and 104b form multiple semiconductor nanostructures 104a'-104b'. The semiconductor nanostructures 104a'-104b' are constructed by or made up of the remaining portions of the semiconductor layers 104a and 104b. The semiconductor nanostructures 104a'-104b' may function as channel structures of transistors.

In some embodiments, the etchant used for removing the semiconductor layers 102a and 102b also slightly removes the semiconductor layers 104a and 104b that form the semiconductor nanostructures 104a'-104b'. As a result, the obtained semiconductor nanostructures 104a'-104b' may become thinner after the removal of the semiconductor layers 102a and 102b.

After the removal of the semiconductor layers 102a and 102b (that function as sacrificial layers), the recesses 144 are formed. The recesses 144 connect to the trench 142 and surround each of the semiconductor nanostructures 104a'-104b'. As shown in FIG. 2M-1, even if the recesses 144 between the semiconductor nanostructures 104a'-104b' are formed, the semiconductor nanostructures 104a'-104b' remain being held by the epitaxial structures 138. Therefore, after the removal of the semiconductor layers 102a and 102b (that function as sacrificial layers), the released semiconductor nanostructures 104a'-104b' are prevented from falling down.

During the removal of the semiconductor layers 102a and 102b (that function as sacrificial layers), the inner spacers 136 and 204 protect the epitaxial structures 138 from being etched or damaged. The quality and reliability of the semiconductor device structure are improved.

As shown in FIGS. 2N-1 and 2N-2, metal gate stacks 156A, 156B, and 156C are formed to fill the trenches 142, in accordance with some embodiments. The metal gate stacks 156A-156C further extend into the recesses 144 to wrap around each of the semiconductor nanostructures 104a'-104b', as shown in FIG. 2N-1.

Each of the metal gate stacks 156A-156C includes multiple metal gate stack layers. Each of the metal gate stacks 156A-156C may include a gate dielectric layer 150 and a metal gate electrode 152. The metal gate electrode 152 may include a work function layer. The metal gate electrode 152 may further include a conductive filling. In some embodiments, the formation of the metal gate stacks 156A-156C involves the deposition of multiple metal gate stack layers over the dielectric layer 140 to fill the trenches 142 and the recesses 144. The metal gate stack layers extend into the recesses 144 to wrap around each of the semiconductor nanostructures 104a'-104b'.

In some embodiments, the gate dielectric layer 150 is made of or includes a dielectric material with high dielectric constant (high-K). The gate dielectric layer 150 may be made of or include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K materials, or a combination thereof. The gate dielectric layer 150 may be deposited using an ALD process, a CVD process, another applicable process, or a combination thereof.

In some embodiments, before the formation of the gate dielectric layer 150, interfacial layers 151 are formed on the surfaces of the semiconductor nanostructures 104a'-104b'. The interfacial layers 151 are very thin and are made of silicon oxide or germanium oxide, for example. In some embodiments, the interfacial layers 151 are formed by applying an oxidizing agent on the surfaces of the semiconductor nanostructures 104a'-104b'. For example, a hydrogen peroxide-containing liquid may be provided or applied on the surfaces of the semiconductor nanostructures 104a'-104b' so as to form the interfacial layers 151.

The work function layer of the metal gate electrode 152 may be used to provide the desired work function for transistors to enhance device performance including improved threshold voltage. In some embodiments, the work function layer is used for forming a PMOS device. The work function layer is a p-type work function layer. The p-type work function layer is capable of providing a work function value suitable for the device, such as equal to or greater than about 4.8 eV.

The p-type work function layer may include metal, metal carbide, metal nitride, another suitable material, or a combination thereof. For example, the p-type metal includes tantalum nitride, tungsten nitride, titanium, titanium nitride, another suitable material, or a combination thereof.

In some embodiments, the work function layer is used for forming an NMOS device. The work function layer is an n-type work function layer. The n-type work function layer is capable of providing a work function value suitable for the device, such as equal to or less than about 4.5 eV.

The n-type work function layer may include metal, metal carbide, metal nitride, or a combination thereof. For example, the n-type work function layer includes titanium nitride, tantalum, tantalum nitride, another suitable material, or a combination thereof. In some embodiments, the n-type work function is an aluminum-containing layer. The aluminum-containing layer may be made of or include TiAlC, TiAlO, TiAlN, another suitable material, or a combination thereof.

The work function layer may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layer may be fine-tuned to adjust the work function level.

The work function layer may be deposited over the gate dielectric layer 150 using an ALD process, a CVD process, a PVD process, an electroplating process, an electroless plating process, another applicable process, or a combination thereof. In some embodiments, the formation of the work function layer involves one or more patterning processes. As a result, the n-type work function layer and the n-type work function layer are selectively formed over respective regions.

In some embodiments, a barrier layer is formed before the work function layer to interface the gate dielectric layer 150 with the subsequently formed work function layer. The barrier layer may also be used to prevent diffusion between the gate dielectric layer 150 and the subsequently formed work function layer. The barrier layer may be made of or include a metal-containing material. The metal-containing material may include titanium nitride, tantalum nitride, another suitable material, or a combination thereof. The barrier layer may be deposited using an ALD process, a CVD process, a PVD process, an electroplating process, an electroless plating process, another applicable process, or a combination thereof.

In some embodiments, the conductive fillings of the metal gate electrodes 152 are made of or include a metal material. The metal material may include tungsten, aluminum, copper, cobalt, another suitable material, or a combination thereof. A conductive layer used for forming the conductive filling may be deposited over the work function layer using a CVD process, an ALD process, a PVD process, an electroplating process, an electroless plating process, a spin coating process, another applicable process, or a combination thereof.

In some embodiments, a blocking layer is formed over the work function layer before the formation of the conductive layer used for forming the conductive filling. The blocking layer may be used to prevent the subsequently formed conductive layer from diffusing or penetrating into the work function layer. The blocking layer may be made of or include tantalum nitride, titanium nitride, another suitable material, or a combination thereof. The blocking layer may be deposited using an ALD process, a PVD process, an electroplating process, an electroless plating process, another applicable process, or a combination thereof.

Afterwards, a planarization process is performed to remove the portions of the metal gate stack layers outside of the trenches 142, in accordance with some embodiments. As a result, the remaining portions of the metal gate stack layers form the metal gate stacks 156A-156C, as shown in FIGS. 2N-1 and 2N-2.

In some embodiments, the conductive filling does not extend into the recesses 144 since the recesses 144 are small and have been filled with other elements such as the gate dielectric layer 150 and the work function layer.

In some embodiments, each of the epitaxial structures 138 that are n-type doped or p-type doped is separated from the semiconductor isolation structure 137 thereunder by the isolation film 206 therebetween. However, embodiments of the disclosure are not limited thereto. Many variations and/or modifications can be made to embodiments of the disclosure. In some other embodiments, some of the epitaxial structures 138 are in direct contact with the semiconductor isolation structures 137 thereunder.

FIGS. 3A-1 to 3D-1 are cross-sectional views of various stages of a process for forming a portion of a semiconductor device structure, in accordance with some embodiments. FIGS. 3A-2 to 3D-2 are cross-sectional views of various stages of a process for forming a portion of a semiconductor device structure, in accordance with some embodiments. As shown in FIGS. 3A-1 and 3A-2, a structure that is the same as or similar to the structure shown in FIGS. 2J-1 and 2J-2 is formed, in accordance with some embodiments.

As shown in FIGS. 3B-1 and 3B-2, some of the isolation films 206 are removed to expose the semiconductor isolation structures 137 thereunder, in accordance with some embodiments. In some embodiments, a patterned mask layer is formed to partially cover a first part the isolation films 206 so that a second part of the isolation films 206 are exposed. Afterwards, one or more etching processes are used to remove the second part of the isolation films 206. As a result, the structure illustrated in FIGS. 3B-1 and 3B-2 is formed.

Figures 1, 2, 3C:
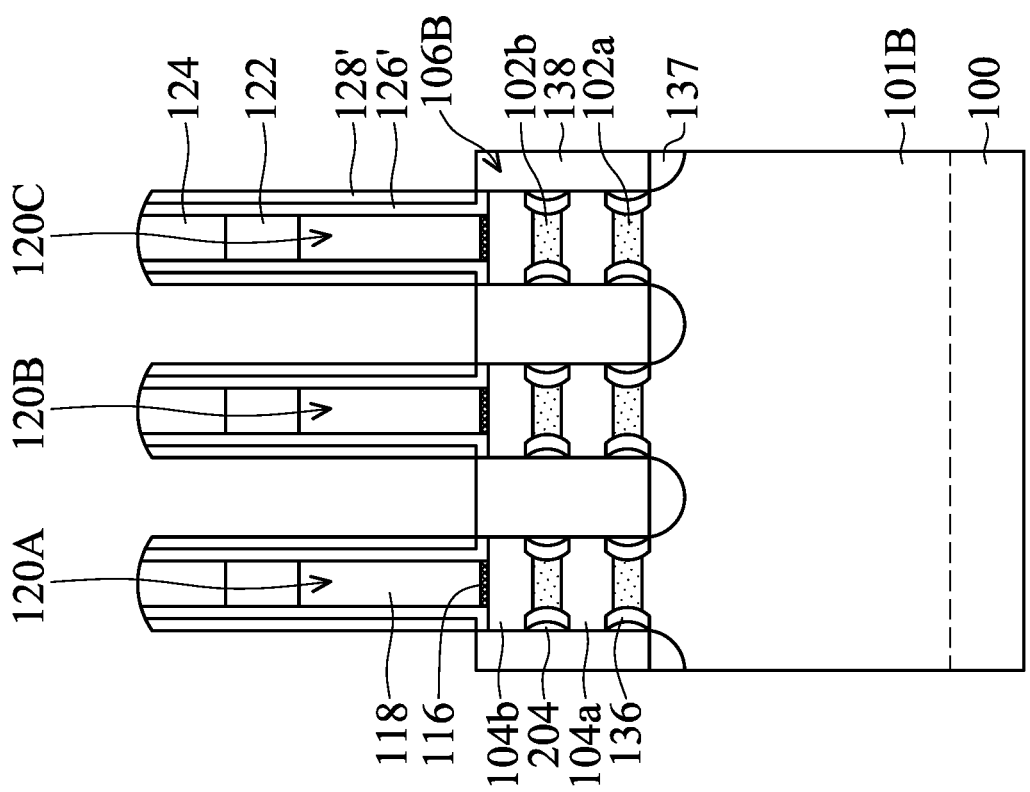

As shown in FIGS. 3C-1 and 3C-2, epitaxial structures 138 are formed on the semiconductor isolation structures 137, in accordance with some embodiments. The material and formation method of the epitaxial structures 138 may be the same as or similar to those of the epitaxial structures 138 shown in FIGS. 2K-1 and 2K-2. In some embodiments, the epitaxial structures 138 shown in FIGS. 3C-1 and 3C-2 are p-type doped. In some embodiments, the epitaxial structures 138 are in direct contact with the semiconductor isolation structures 137 thereunder. Due to the lattice mismatch between the epitaxial structures 138 and the semiconductor isolation structures 137, higher stain may be applied on the semiconductor nanostructures 104a'-104b'. The performance and reliability of the semiconductor device structure may be improved.

Afterwards, similar to the embodiments illustrated in FIGS. 2L-1 to 2N-1 and FIGS. 2L-2 to 2N-2, a gate replacement process is performed. As a result, the metal gate stacks 156A-156C are formed to wrap around the semiconductor nanostructures 104a'-104b', as shown in FIGS. 3D-1 and 3D-2 in accordance with some embodiments.

Figure 4:
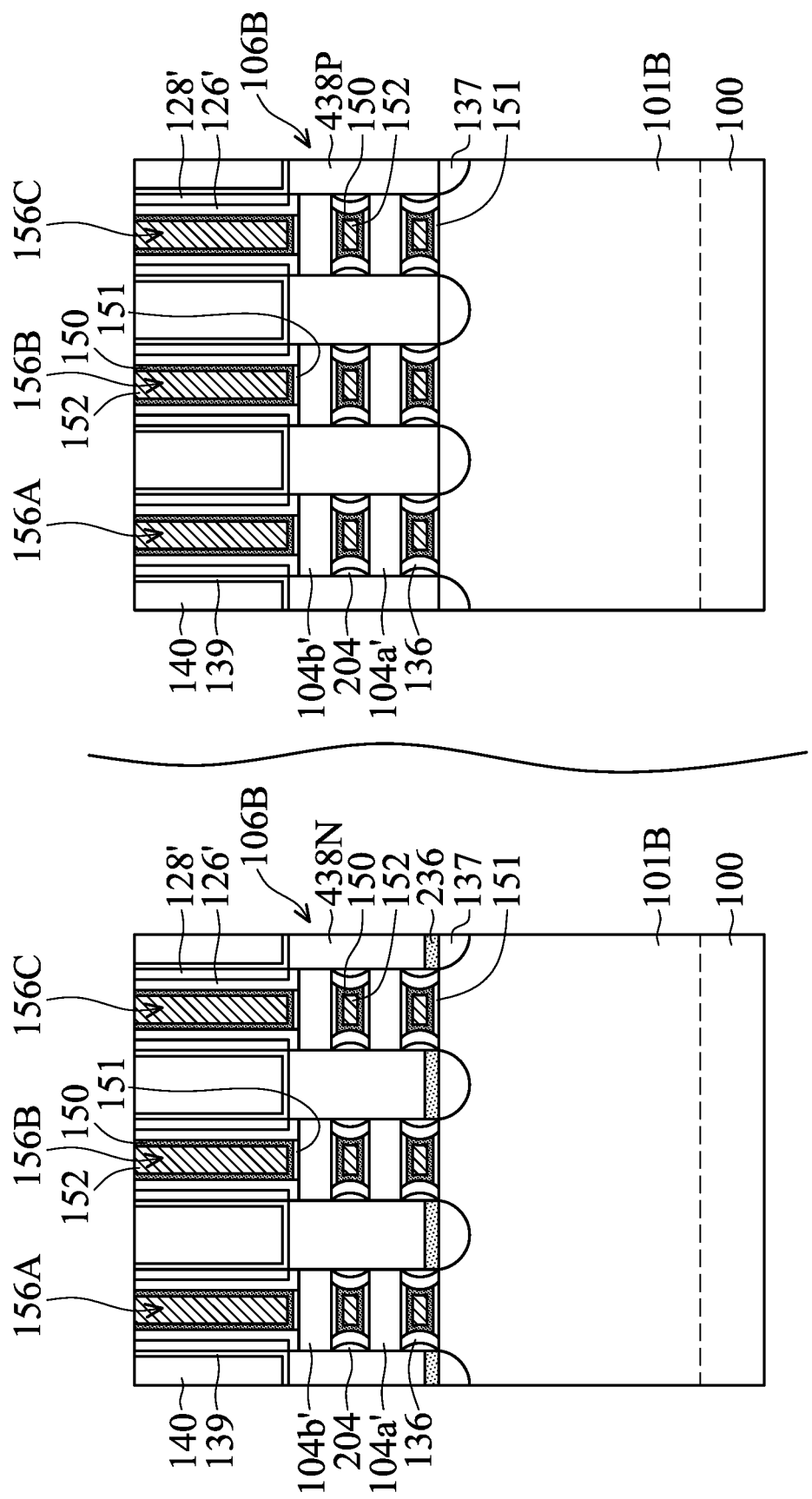
FIG. 4 is a cross-sectional view of an intermediate stage of a process for forming a portion of a semiconductor device structure, in accordance with some embodiments.

As illustrated in the embodiments shown in FIGS. 3A-1 to 3D-1 and 3A-2 to 3D-2, some parts of the isolation films 236 are selectively removed. FIG. 4 is a cross-sectional view of an intermediate stage of a process for forming a portion of a semiconductor device structure, in accordance with some embodiments. In some embodiments, multiple epitaxial structures 438N that are n-type doped are formed in a first region of the semiconductor device structure. Multiple epitaxial structures 438P that are p-type doped are formed in a second region of the semiconductor device structure. The epitaxial structures 438N and 438P may be sequentially formed. The material and formation method of the epitaxial structures 438N may be the same as or similar to the epitaxial structures 138 that are n-type doped as illustrated in FIGS. 2K-1 and 2K-2. The material and formation method of the epitaxial structures 438P may be the same as or similar to the epitaxial structures 138 that are p-type doped as illustrated in FIGS. 2K-1 and 2K-2.

In some embodiments, each of the epitaxial structures 438N is separated from the semiconductor isolation structure 137 thereunder by the isolation film 236 thereunder. The isolation film 236 therebetween may prevent or reduce leakage current from the epitaxial structure 438N.

In some embodiments, the isolation films 236 are selectively removed. No isolation film is formed in the second region where the epitaxial structures 438P are formed. In some embodiments, the epitaxial structures 438P are in direct contact with the semiconductor isolation structures 236.

Figure 5:
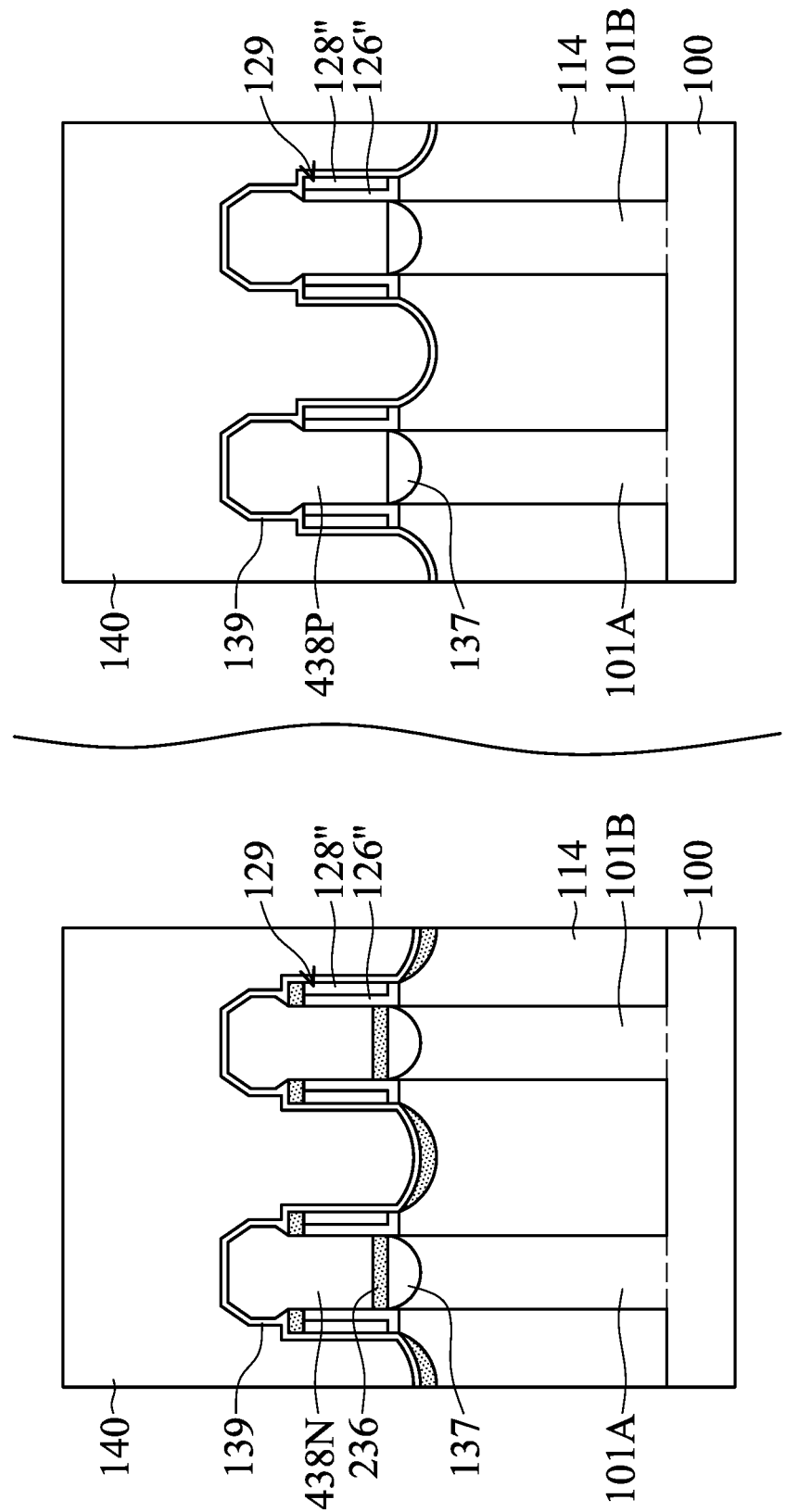
FIG. 5 is a cross-sectional view of an intermediate stage of a process for forming a portion of a semiconductor device structure, in accordance with some embodiments.

FIG. 5 is a cross-sectional view of an intermediate stage of a process for forming a portion of a semiconductor device structure, in accordance with some embodiments. In some embodiments, similar to the embodiments shown in FIG. 4, each of the epitaxial structures 438N is separated from the semiconductor isolation structure 137 thereunder by the isolation film 236 thereunder, as shown in FIG. 5. The isolation film 236 therebetween may prevent or reduce leakage current from the epitaxial structure 438N. Similar to the embodiments shown in FIG. 2N-1, some of the isolation film 236 are between the contact etch stop layer 139 and the spacer structures 129. In some embodiments, the tops of the spacer structures 129 are separated from the contact etch stop layer 139 by the isolation films 236.

In some embodiments, similar to the embodiments shown in FIG. 4, the isolation films 236 are selectively removed, as shown in FIG. 5. No isolation film is formed in the second region where the epitaxial structures 438P are formed. In some embodiments, the epitaxial structures 438P are in direct contact with the semiconductor isolation structures 236. In some embodiments, the tops of the spacer structures 129 are in direct contact with the contact etch stop layer 139.

Figures 1, 2, 6A:
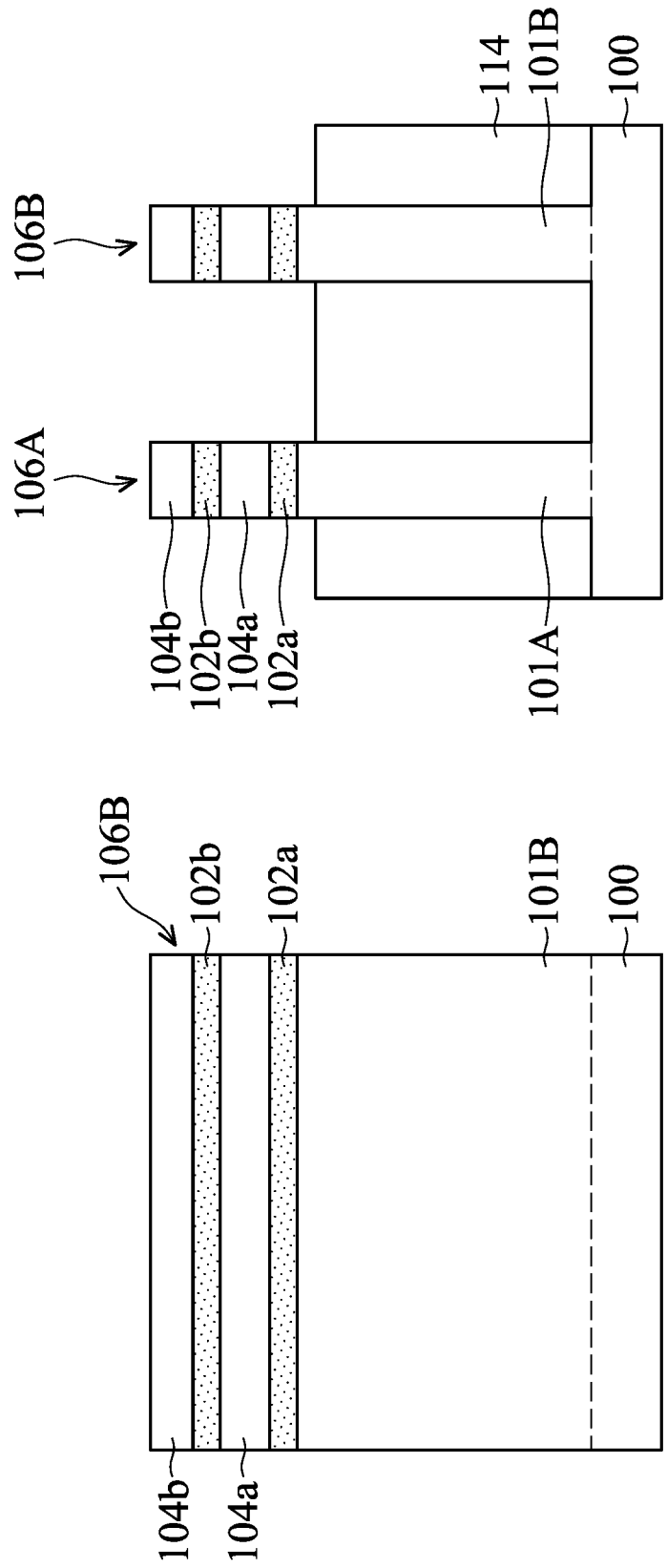
Figures 1, 2, 6C:
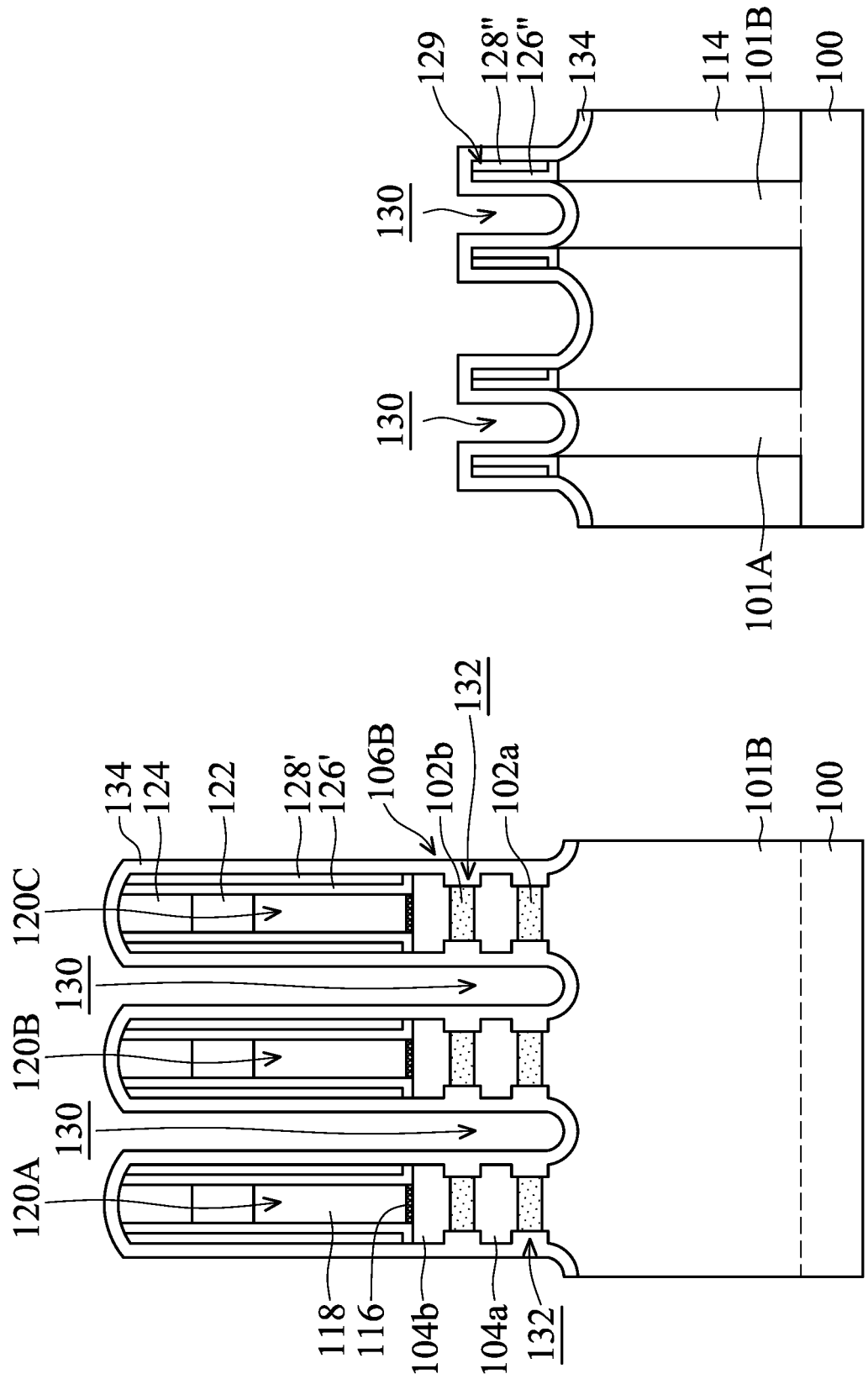

Many variations and/or modifications can be made to embodiments of the disclosure. FIGS. 6A-1 to 6H-1 are cross-sectional views of various stages of a process for forming a portion of a semiconductor device structure, in accordance with some embodiments. FIGS. 6A-2 to 6H-2 are cross-sectional views of various stages of a process for forming a portion of a semiconductor device structure, in accordance with some embodiments.

As shown in FIGS. 6A-1 and 6A-2, a structure that is the same as or similar to the structure shown in FIGS. 2A-1 and 2A-2 is formed, in accordance with some embodiments. Afterwards, the processes that is the same as or similar to those illustrated in FIGS. 2B-1 and 2B-2 are performed. As a result, the structure shown in FIGS. 6B-1 and 6B-2 is formed, in accordance with some embodiments.

Afterwards, the processes that is the same as or similar to those illustrated in FIGS. 2C-1 to 2E-1 and 2B-2 to 2E-2 are performed. As a result, the structure shown in FIGS. 6C-1 and 6C-2 is formed, in accordance with some embodiments.

As shown in FIGS. 6D-1 and 6D-2, one or more modifiers are introduced into portions of the inner spacer layer 134, so as to form multiple modified regions 604 of the inner spacer layer 134, in accordance with some embodiments. One or more implantation process 602 may be used to form the modified regions 604. The modified regions 604 may be formed on the tops of the dummy gate stacks 120A-120C and the bottoms of the recesses 130.

The modifiers may include nitrogen atoms, nitrogen-containing ions, carbon atoms, carbon-containing ions, silicon atoms, silicon-containing ions, nitrogen molecules, nitrogen-containing molecules, another suitable modifier, or a combination thereof. In some embodiments, the implantation angle applied in the implantation process 602 is substantially equal to zero. Therefore, the portions of the inner spacer layer 134 that are located on the sidewalls of the dummy gate stacks 120A-120C and the spacer structures 129 are free of the implanted modifiers.

Figures 1, 2, 6E:
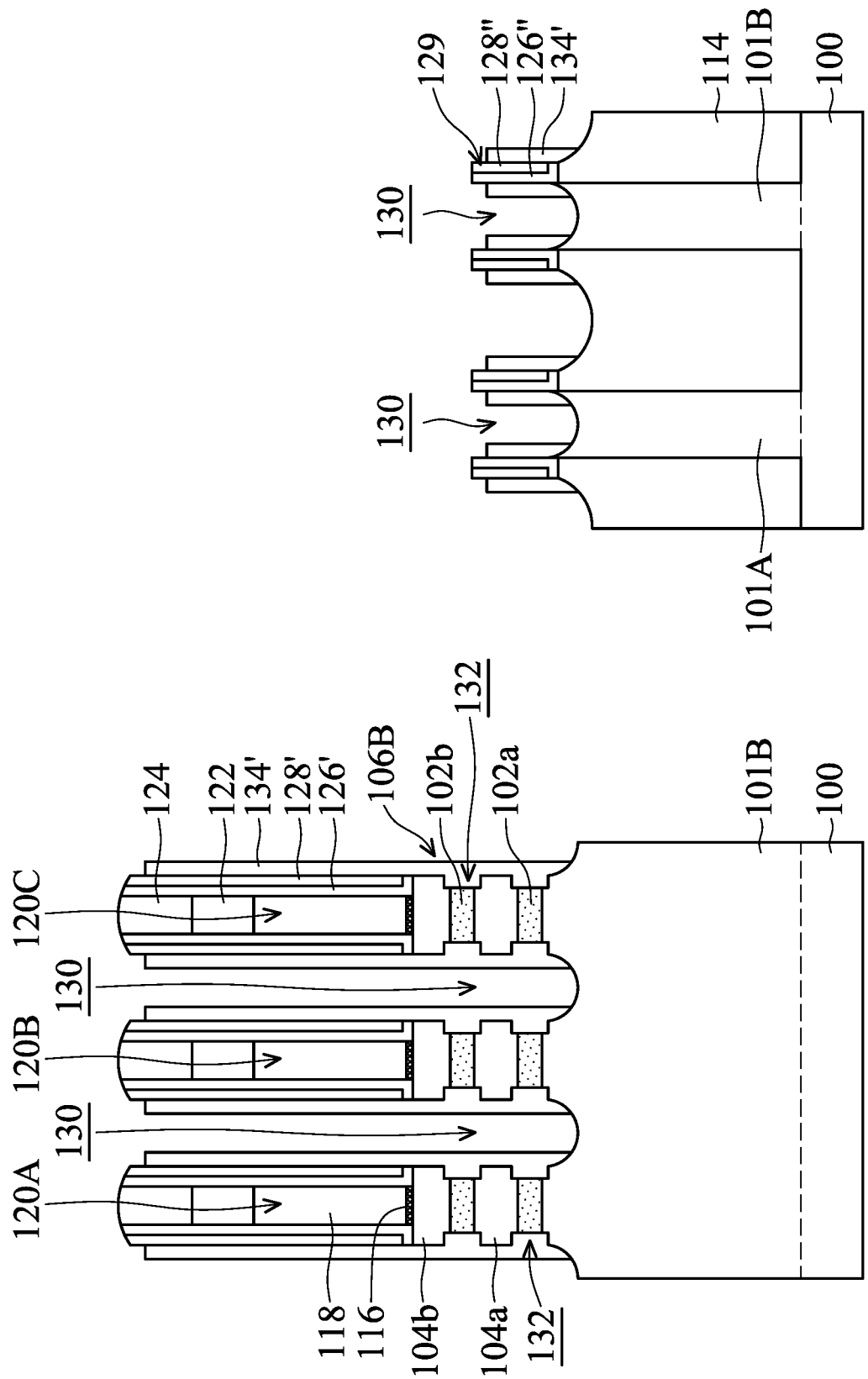
Figures 1, 2, 6H:
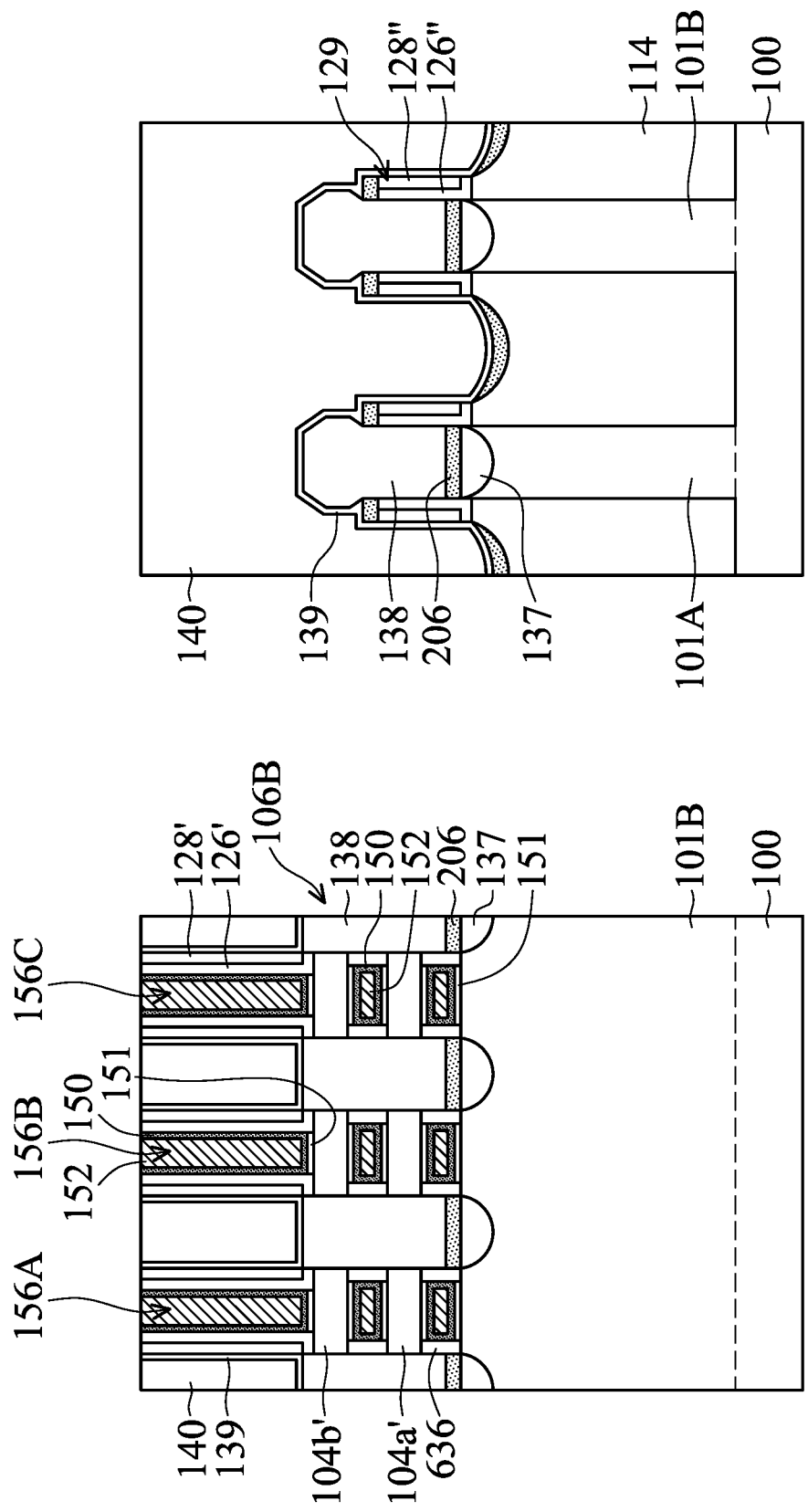

As shown in FIGS. 6E-1 and 6E-2, the modified regions 604 of the inner spacer layer 134 are removed, in accordance with some embodiments. As a result, a patterned inner spacer layer 134' is formed. The semiconductor fins 101A-101B are thus partially exposed, as shown in FIGS. 6E-1 and 6E-2.

As shown in FIGS. 6F-1 and 6F-2, an etching process is used to partially remove the patterned inner spacer layer 134', in accordance with some embodiments. The portions of the patterned inner spacer layer 134' that are outside of the recesses 132 may be removed, as shown in FIGS. 6F-1 and 6F-2. The remaining portions of the patterned inner spacer layer 134' form inner spacers 636, as shown in FIG. 6F-1.

In some embodiments, the etching process is an isotropic etching process. The etching process may include a dry etching process, a wet etching process, or a combination thereof. The etching process may be carefully controlled so that it does not substantially etch the gate spacers 126' and 128' or the spacer structures 129. The spacer structures 129 may thus have sufficient height, which facilitates the subsequent formation of epitaxial structures. The nearby epitaxial structures may be prevented from being merged together due to the spacer structures 129.

The inner spacers 636 cover the edges of the semiconductor layers 102a and 102b. The inner spacers 636 may be used to prevent subsequently formed epitaxial structures (that function as, for example, source/drain structures) from being damaged during a subsequent process for removing the semiconductor layers 102a and 102b.

The patterned inner spacer layer 134' has openings that expose the bottoms of the recesses 130. The etching time for the patterned inner spacer layer 134' may be significantly reduced. The laterally etch of the patterned inner spacer layer 134' may thus be minimized since the etching time is reduced. The dishing degree of the inner spacers 636 may thus be minimized, which ensures the quality of the inner spacers 636. The risk of short circuiting between the gate electrode and the source/drain structures is substantially reduced. In some embodiments, the edges of the inner spacers 636 and the semiconductor layers 104a-104b are substantially aligned with each other.

In some embodiments, the inner spacers 636 are made of a low-k material that has a lower dielectric constant than that of silicon oxide. In these cases, the inner spacers 636 may also be used to reduce parasitic capacitance between the subsequently formed source/drain structures and the gate stacks. As a result, the operation speed of the semiconductor device structure may be improved.

As shown in FIGS. 6G-1 and 6G-2, similar to the embodiments illustrated in FIGS. 2J-1 and 2J-2, the isolation films 206 are formed, in accordance with some embodiments.

Afterwards, the processes that is the same as or similar to those illustrated in FIGS. 2K-1 to 2N-1 and 2K-2 to 2N-2 are performed. As a result, the structure shown in FIGS. 6H-1 and 6H-2 is formed, in accordance with some embodiments.

Figure 7:
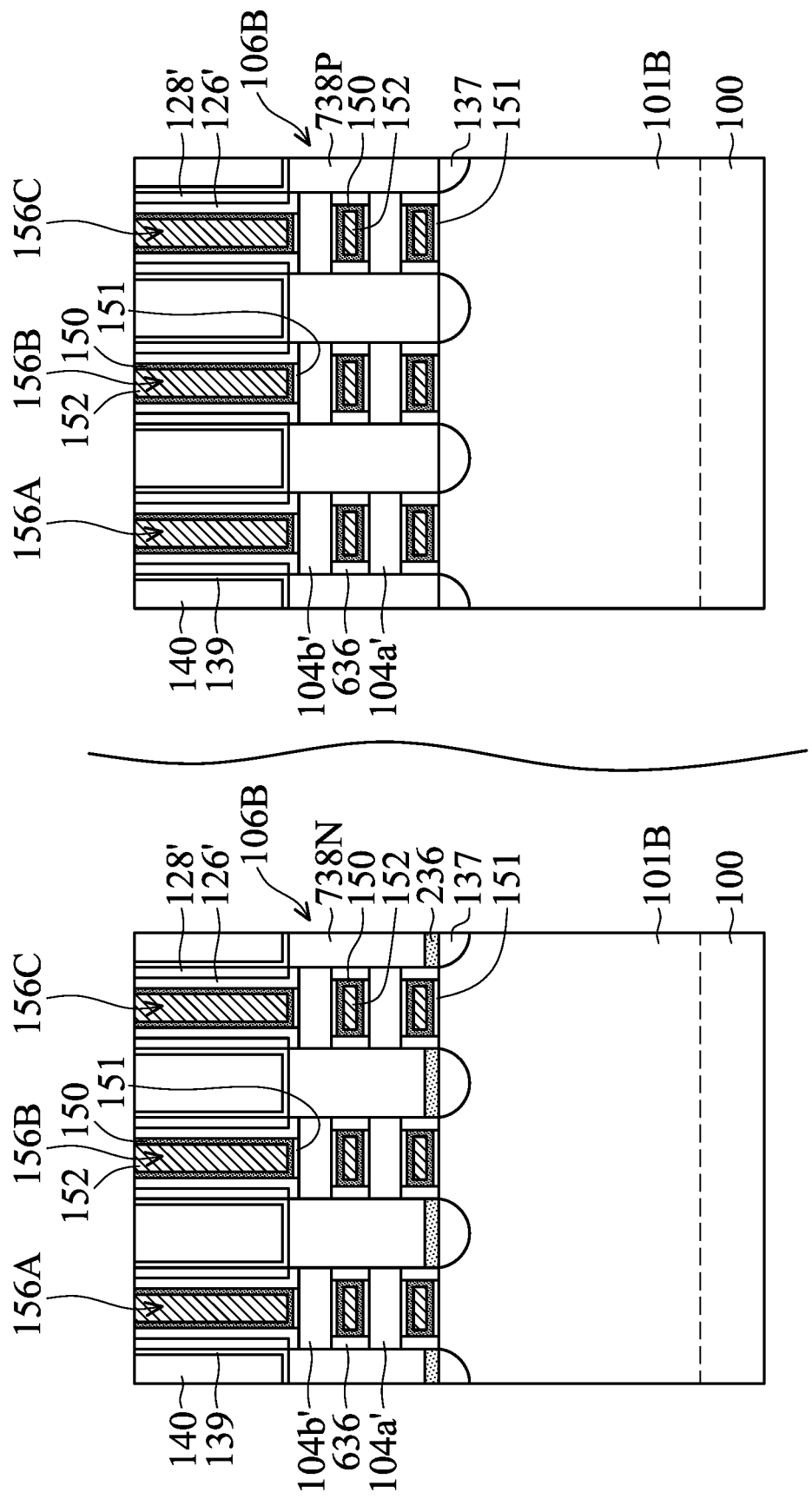
FIG. 7 is a cross-sectional view of an intermediate stage of a process for forming a portion of a semiconductor device structure, in accordance with some embodiments.

Many variations and/modifications can be made to embodiments of the disclosure. In some embodiments, the isolation films 206 are selectively removed before the formation of the epitaxial structures. FIG. 7 is a cross-sectional view of an intermediate stage of a process for forming a portion of a semiconductor device structure, in accordance with some embodiments.

In some embodiments, multiple epitaxial structures 738N that are n-type doped are formed in a first region of the semiconductor device structure, as shown in the left portion of FIG. 7. Multiple epitaxial structures 738P that are p-type doped are formed in a second region of the semiconductor device structure, as shown in the right portion of FIG. 7. The epitaxial structures 738N and 738P may be sequentially formed. The material and formation method of the epitaxial structures 738N may be the same as or similar to the epitaxial structures 138 that are n-type doped as illustrated in FIGS. 2K-1 and 2K-2. The material and formation method of the epitaxial structures 738P may be the same as or similar to the epitaxial structures 138 that are p-type doped as illustrated in FIGS. 2K-1 and 2K-2.

In some embodiments, each of the epitaxial structures 738N is separated from the semiconductor isolation structure 137 thereunder by the isolation film 236 thereunder. The isolation film 236 therebetween may prevent or reduce leakage current from the epitaxial structure 738N.

In some embodiments, the isolation films 236 are selectively removed. No isolation film is formed in the second region where the epitaxial structures 738P are formed. In some embodiments, the epitaxial structures 738P are in direct contact with the semiconductor isolation structures 236. Due to the lattice mismatch between the epitaxial structures 738P and the semiconductor isolation structures 137, higher stain may be applied on the semiconductor nanostructures 104a'-104b'. The performance and reliability of the semiconductor device structure may be improved.

Embodiments of the disclosure form a semiconductor device structure with inner spacers between the epitaxial structures and the semiconductor nanostructures. The formation of the inner spacers involves one or more isotropic etching process. Since no anisotropic etching process is used during the formation of the inner spacers, the spacer structures designed for confining the growth of the epitaxial structures are substantially not damaged. The spacer structures may thus have sufficient height, which facilitates the formation of epitaxial structures. The nearby epitaxial structures may be prevented from being merged together due to the spacer structures. The performance and reliability of the semiconductor device structure are greatly improved.

In accordance with some embodiments, a method for forming a semiconductor device structure is provided. The method includes forming a fin structure over a substrate, and the fin structure has multiple sacrificial layers and multiple semiconductor layers laid out alternately. The method also includes forming a dummy gate stack wrapped around the fin structure and partially removing the fin structure to form a recess exposing side surfaces of the semiconductor layers and the sacrificial layers. The method further includes forming first inner spacers covering the side surfaces of the sacrificial layers and forming a semiconductor isolation structure over a bottom of the recess. In addition, the method includes forming second inner spacers over the first inner spacers and forming an isolation film over the semiconductor isolation structure. The method includes forming an epitaxial structure on the side surfaces of the semiconductor layers. The method also includes removing the dummy gate stack and the sacrificial layers to release multiple semiconductor nanostructures constructed by remaining portions of the semiconductor layers. The method further includes forming a metal gate stack wrapped around the semiconductor nanostructures.

In accordance with some embodiments, a method for forming a semiconductor device structure is provided. The method includes forming a fin structure over a substrate, and the fin structure has multiple sacrificial layers and multiple semiconductor layers laid out alternately. The method also includes forming a gate stack wrapped around the fin structure and forming a spacer layer extending along sidewalls and tops of the fin structure and the gate stack. The method further includes partially removing the fin structure and the spacer layer to form a recess exposing side surfaces of the semiconductor layers and the sacrificial layers. A remaining portion of the spacer layer forms a gate spacer along the sidewall of the gate stack. In addition, the method includes forming an inner spacer layer along a sidewall and a bottom of the recess and partially removing the inner spacer layer using an isotropic etching process. Remaining portions of the inner spacer layers form multiple inner spacers, and the isotropic etching process does not substantially etch the gate spacer. The method includes forming an epitaxial structure in the recess.

In accordance with some embodiments, a semiconductor device structure is provided. The semiconductor device structure includes multiple semiconductor nanostructures over a substrate. The semiconductor device structure also includes a first epitaxial structure and a second epitaxial structure. Each of the semiconductor nanostructures is between the first epitaxial structure and the second epitaxial structure. The semiconductor device structure further includes a gate stack wrapped around each of the semiconductor nanostructures. In addition, the semiconductor device structure includes multiple inner spacers, and each of the inner spacers electrically isolates the gate stack from the first epitaxial structure and the second epitaxial structure. The semiconductor device structure includes a third epitaxial structure between the first epitaxial structure and the substrate, and the third epitaxial structure is undoped. The semiconductor device structure also includes an isolation film between the first epitaxial structure and the third epitaxial structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a fin structure over a substrate, wherein the fin structure has a plurality of sacrificial layers and a plurality of semiconductor layers laid out alternately;
    forming a dummy gate stack wrapped around the fin structure;
    partially removing the fin structure to form a recess exposing side surfaces of the semiconductor layers and the sacrificial layers;
    forming first inner spacers covering the side surfaces of the sacrificial layers;
    forming a semiconductor isolation structure over a bottom of the recess;
    forming second inner spacers over the first inner spacers;
    forming an isolation film over the semiconductor isolation structure;
    forming an epitaxial structure on the side surfaces of the semiconductor layers;
    removing the dummy gate stack and the sacrificial layers to release a plurality of semiconductor nanostructures constructed by remaining portions of the semiconductor layers; and
    forming a metal gate stack wrapped around the semiconductor nanostructures.

2. The method for forming a semiconductor device structure as claimed in claim 1, further comprising:
  partially removing the sacrificial layers to form second recesses after the recess is formed;
  forming a first inner spacer layer along a sidewall and a bottom of the recess, wherein the first inner spacer layer overfills the second recesses; and
  partially removing the first inner spacer layer using an isotropic etching process, wherein remaining portions of the first inner spacer layers form the first inner spacers.

3. The method for forming a semiconductor device structure as claimed in claim 2, further comprising:
  forming a spacer layer extending along sidewalls and tops of the fin structure and the dummy gate stack before the recess is formed; and
  partially removing the spacer layer during the formation of the recess, wherein a first remaining portion of the spacer layer forms a gate spacer along the sidewall of the dummy gate stack, a second remaining portion of the spacer layer forms a spacer structure, and the spacer structure extends along a sidewall of the epitaxial structure after the epitaxial structure is formed.

4. The method for forming a semiconductor device structure as claimed in claim 3, wherein the isotropic etching process used for partially removing the first inner spacer layer does not substantially etch the spacer structure.

5. The method for forming a semiconductor device structure as claimed in claim 3, further comprising:
  forming a second isolation film on a top of the spacer structure, wherein the second isolation film and the isolation film are made of the same material.

6. The method for forming a semiconductor device structure as claimed in claim 2, further comprising:
  forming a second inner spacer layer over the first inner spacers and the semiconductor isolation structure, wherein the second inner spacer layer overfills the second recesses; and
  partially removing the second inner spacer layer using a second isotropic etching process, wherein remaining portions of the second inner spacer layers form the second inner spacers.

7. The method for forming a semiconductor device structure as claimed in claim 1, wherein the semiconductor isolation structure is formed to have a substantially planar top surface.

8. The method for forming a semiconductor device structure as claimed in claim 1, further comprising:
  at least partially removing the isolation film to expose the semiconductor isolation structure after the formation of the second inner spacers and before the formation of the epitaxial structure.

9. The method for forming a semiconductor device structure as claimed in claim 8, wherein the epitaxial structure is p-type doped.

10. The method for forming a semiconductor device structure as claimed in claim 1, wherein the isolation film is in direct contact with the epitaxial structure and one of the second spacers.

11. A method for forming a semiconductor device structure, comprising:
  forming a fin structure over a substrate, wherein the fin structure has a plurality of sacrificial layers and a plurality of semiconductor layers laid out alternately;
  forming a gate stack wrapped around the fin structure;
  forming a spacer layer extending along sidewalls and tops of the fin structure and the gate stack;
  partially removing the fin structure and the spacer layer to form a recess exposing side surfaces of the semiconductor layers and the sacrificial layers, wherein a remaining portion of the spacer layer forms a gate spacer along the sidewall of the gate stack;
  forming an inner spacer layer along a sidewall and a bottom of the recess;
  partially removing the inner spacer layer using an isotropic etching process, wherein remaining portions of the inner spacer layers form a plurality of inner spacers, and the isotropic etching process does not substantially etch the gate spacer; and
  forming an epitaxial structure in the recess.

12. The method for forming a semiconductor device structure as claimed in claim 11, wherein a second remaining portion of the spacer layer forms a spacer structure, the spacer structure extends along a sidewall of the epitaxial structure after the epitaxial structure is formed, and the isotropic etching process does not substantially etch the spacer structure.

13. The method for forming a semiconductor device structure as claimed in claim 11, further comprising:
  introducing a modifier into a portion of the inner spacer layer located on the bottom of the recess to form a modified region of the inner spacer layer; and
  removing the modified region to expose the bottom of the recess before the isotropic etching process for forming the inner spacers.

14. The method for forming a semiconductor device structure as claimed in claim 11, further comprising:
  forming a semiconductor isolation structure over the bottom of the recess; and
  forming an isolation film over the semiconductor isolation structure before the epitaxial structure is formed.

15. The method for forming a semiconductor device structure as claimed in claim 14, further comprising:
  forming a second inner spacer directly on one of the inner spacers after the formation of the semiconductor isolation structure and before the formation of the isolation film.

16. A method for forming a semiconductor device structure, comprising:
  forming a plurality of sacrificial layers and a plurality of semiconductor layers laid out alternately;
  forming a gate stack partially covering the sacrificial layers and the semiconductor layers;
  forming a spacer layer over the gate stack, the sacrificial layers and the semiconductor layers;
  partially removing the sacrificial layers, the semiconductor layers, and the spacer layer to form a recess exposing side surfaces of the semiconductor layers and the sacrificial layers, wherein a remaining portion of the spacer layer forms a gate spacer beside the gate stack;
  forming an inner spacer layer along a sidewall and a bottom of the recess;
  partially removing the inner spacer layer using an isotropic etching process, wherein remaining portions of the inner spacer layers form a plurality of inner spacers; and
  forming an epitaxial structure in the recess.

17. The method for forming a semiconductor device structure as claimed in claim 16, wherein the isotropic etching process does not substantially etch the gate spacer.

18. The method for forming a semiconductor device structure as claimed in claim 16, wherein a second remaining portion of the spacer layer forms a spacer structure, the spacer structure extends along a sidewall of the epitaxial structure after the epitaxial structure is formed, and the isotropic etching process does not substantially etch the spacer structure.

19. The method for forming a semiconductor device structure as claimed in claim 16, further comprising:
   introducing a modifier into a portion of the inner spacer layer located on the bottom of the recess to form a modified region of the inner spacer layer; and
   removing the modified region to expose the bottom of the recess before the isotropic etching process for forming the inner spacers.

20. The method for forming a semiconductor device structure as claimed in claim 16, further comprising:
   forming a plurality of second inner spacers covering the inner spacers before the epitaxial structure is formed.

* * * * *